United States Patent [19]

Waggener, Jr.

[11] Patent Number: 5,161,117
[45] Date of Patent: Nov. 3, 1992

[54] FLOATING POINT CONVERSION DEVICE AND METHOD

[75] Inventor: William N. Waggener, Jr., Sarasota, Fla.

[73] Assignee: Fairchild Weston Systems, Inc., Sarasota, Fla.

[21] Appl. No.: 361,588

[22] Filed: Jun. 5, 1989

[51] Int. Cl.$^5$ .............................................. G06F 7/00
[52] U.S. Cl. .................. 364/715.03; 364/748
[58] Field of Search ............. 364/748, 715.01, 715.03, 364/715.05

[56] References Cited

U.S. PATENT DOCUMENTS

| | | | |
|---|---|---|---|
| 3,193,669 | 7/1965 | Voltin | 364/748 |
| 3,872,442 | 3/1975 | Boles et al. | 364/715.03 X |
| 4,189,715 | 2/1980 | Duttweiler | 340/347 DD |
| 4,413,326 | 11/1983 | Wilson et al. | 364/748 |
| 4,477,879 | 10/1984 | Wong | 364/748 X |
| 4,488,252 | 12/1984 | Vassar | 364/748 |
| 4,534,010 | 8/1985 | Kobayashi et al. | 364/748 |
| 4,562,553 | 12/1985 | Mattedi et al. | 364/748 |
| 4,595,911 | 6/1986 | Kregness et al. | 364/200 X |
| 4,631,696 | 12/1986 | Sakamoto | 364/748 |
| 4,675,809 | 6/1987 | Omoda et al. | 364/748 X |
| 4,831,575 | 5/1989 | Kuroda | 364/748 |

OTHER PUBLICATIONS

*The Programmable Gate Array Data Book*, Xilinx, Inc., San Jose, California, 1988, Chapter 2 (Product Specifications) and Chapter 6 (Applications).
*Production Data*, Texas Instruments, Inc., Dallas, TX, 1985, "SN54AS8838, SN74AS8838 32-Bit Barrel Shifters", pp. 2-523 through 2-532.

*Primary Examiner*—Tan V. Mai
*Attorney, Agent, or Firm*—Sterne, Kessler, Goldstein & Fox

[57] ABSTRACT

A high-speed floating point conversion apparatus and method are disclosed, with special reference to selectable conversion of "source" IEEE format numbers to any of the "destination" IBM, DEC, or SEL formats. In the preferred embodiment, the exponent is input to a shift control block. The exponent is converted to a different base, resulting in a remainder. The remainder of the exponent base conversion is input to the shift position control input of a shift register (preferably a barrel shifter) which has received the fraction (or mantissa) of the original floating point number. The fraction is shifted an amount necessary to compensate for the exponent's base conversion. The shift position control bits are available after a very short period of time, so that the shifting process of the barrel shifter is also completed quickly. The exponent and shifted fraction (or mantissa) are then input to format conversion units which format the data bitwise as necessary for a particular output format. Advantageously, clamping functions within the format conversion units handle special cases such as infinities. From the format conversion units the converted data is steered to appropriate output buffers. In parallel with the floating point data conversion process occur such processes as tag and index processing.

24 Claims, 11 Drawing Sheets

FLOATING POINT CONVERSION DEVICE AND METHOD

BACKGROUND OF THE INVENTION

1. Field of the Invention

The present invention relates to devices and methods for converting floating point numbers in one format to floating point numbers in another format. More specifically, the invention relates to devices and methods for converting IEEE-format floating point numbers into such floating point formats as the IBM, DEC, and SEL formats.

2. Related Art

Floating point conversion circuits and arithmetic units are known in the art.

For example, U.S. Pat. No. 3,193,669 to Voltin, U.S. Pat. No. 3,872,442 to Boles et al., U.S. Pat. No. 4,189,715 to Duttweiler, U.S. Pat. No. 4,413,326 to Wilson et al., U.S. Pat. No. 4,477,879 to Wong, U.S. Pat. No. 4,488,252 to Vasser, U.S. Pat. No. 4,534,010 to Kobayashi et al., U.S. Pat. No. 4,562,553 to Mattedi et al., U.S. Pat. No. 4,595,911 to Kregness et al., U.S. Pat. No. 4,631,696 to Sakamoto, and U.S. Pat. No. 4,675,809 to Omoto et al. disclose various known systems which either convert floating point numbers from one format into another, or conduct floating point operations in which one or more floating point numbers are the operands.

Known floating point conversion systems are relatively deficient in the ability to quickly convert floating point numbers of certain formats into floating point numbers of other formats. When such conversions are necessary, for example, in data processing or data transmission applications, the speed of the floating point conversion process becomes crucial to overall system throughput.

When considering hardware implementations of floating point conversion algorithms, regardless of the technology involved (TTL, ECL, etc.), there is always a need to improve processing speed so that any bottlenecks in the system are not due to basic operations such as floating point conversions.

If the conversion task is performed in serial steps in software, significant delays may occur. For example, software used to duplicate the task of converting a 32-bit single precision floating point number is achieved in approximately 20 microseconds using a microcode-driven DPU (Distributed Processing Unit), a fast bit-slice processor. In contrast, as will be described below, the 32-bit conversion is achieved on parallel data in 480 nanoseconds using TTL technology, when utilizing the hardware conversion device and method according to the present invention.

Therefore, there exists a need for an efficient, fast floating point conversion method, preferably implemented using simple hardware.

SUMMARY OF THE INVENTION

The present invention overcomes the limitations of the prior art through a method, and a device for implementation of the method, in which the exponent of the number to be converted is manipulated so as to be changed to a different base. A result of the exponent manipulation is used as an input to a barrel shift register so as to shift the fraction (or mantissa) of the number a proper amount to compensate for the base conversion of the exponent.

In the preferred embodiment, the exponent is input to a shift control logic block. The exponent is converted to a different base, resulting in a remainder. The remainder of the exponent base conversion is input to the shift control inputs of a shift register which has received the fraction (or mantissa) of the original floating point number.

An advantage of this arrangement is that the shift control bits are available after a very short period of time, so that the shifting process of the shift register is also completed quickly.

The exponent and shifted fraction (or mantissa) are then input to format blocks which format the data bit-wise as necessary for a particular output format. Advantageously, clamping circuits handle special cases, such as infinities and denormalized numbers.

In parallel with the floating point data conversion process occur such processing as tag and index processing.

BRIEF DESCRIPTION OF THE DRAWINGS

The invention is best understood by reading the following Detailed Description while referring to the accompanying drawings, in which like reference numbers refer to like elements throughout, and in which.

DETAILED DESCRIPTION OF THE PREFERRED EMBODIMENTS

Figure 1:
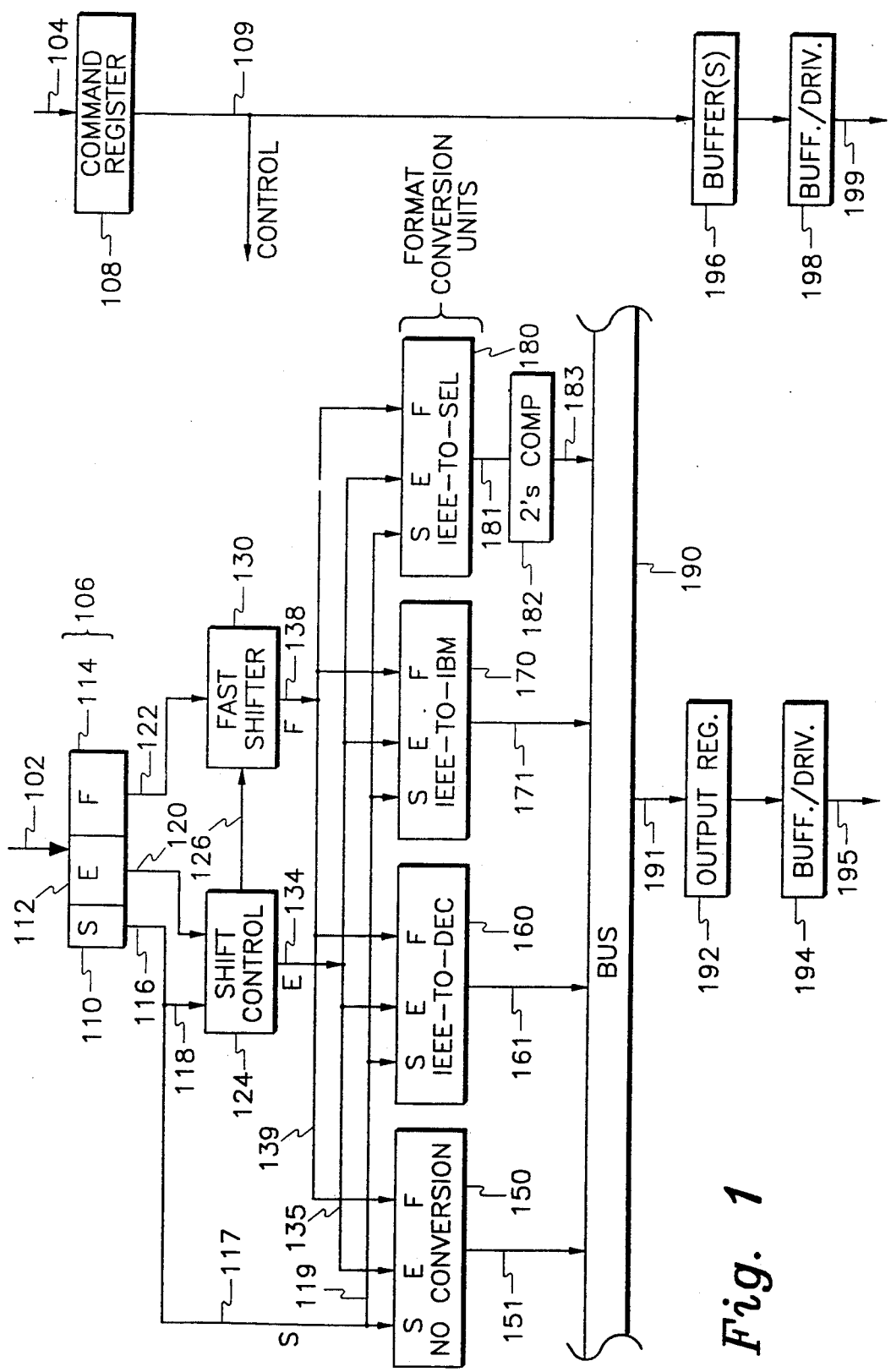
FIG. 1 is a high-level block diagram of the preferred embodiment of the floating point conversion device according to the present invention.

The preferred embodiment of the present invention involves a method and apparatus for converting floating point numbers in a source format such as the IEEE format to a selected one of a group of destination formats such as the IBM format, the DEC format, or the SEL format. The present invention finds special utility in implementing the format conversions in a parallel output module (POM), in which IEEE floating point numbers must be selectably converted to any one of the three other formats (or not converted at all) for use by other equipment. However, it should be understood that the teachings of the present invention may be applied well beyond those which are particularly described here. Modifications and variations of the preferred embodiments described herein lie within the contemplation of the present invention, and within the ability of one skilled in the art. Thus, the present specification of the preferred embodiments are exemplary, and not limiting in nature.

For brevity, and to indicate the breadth of the invention, the term "source" will be used in this specification to refer to the unconverted (e.g., IEEE) number or its components; the term "destination" will be used to refer to the post-conversion (e.g., DEC, IBM, SEL) number or its components.

For ease of understanding, a brief description of the various formats involved in the conversion format according to the preferred embodiment are presented.

IEEE Floating Point Format. Bit 31 is a sign bit s, with 0 indicating a positive number; 1, a negative number. The 8 bits from position 30 through position 23 are the exponent E, which is defined as a power of 2, with a bias of 127. The fraction F is a 23-bit entity extending from bit 22 through bit 0. The number is represented in the following way:

$$(-1)^s*(1.F)*(2^{E-127})$$

Where s is the sign bit, E is the value of the exponent, and F is the fraction (to be added to 1.0) to give an effective mantissa. The "1" in the "1.F" is the implied bit in the IEEE floating point format.

In positive numbers, s=0, the exponent is normal, and the fraction is positive. For negative numbers, s=1, the exponent is normal, and the fraction is positive.

IBM Short Floating Point Format. Bit 0 is a sign bit s, with 0 indicating a positive number; 1, a negative number. The exponent E extends from bit 1 through bit 7, and is a 7-bit number with a bias of 64. Bits 8 through 31 comprise the mantissa F, six 4-bit hex digits. The number is represented as follows:

$$(-1)^{s}*F*16^{E-64}$$

For positive numbers, s=0, the exponent is normal and the fraction is positive. For negative numbers, s=1, the exponent is normal, and the fraction is positive.

SEL Short Floating Point Format. Bit 0 is the sign bit s, with 0 indicating a positive number; 1, a negative number. The exponent E occupies bits 1-7, and is a power of 16 with a bias of 64. Bits 8-31 comprise the mantissa F, six 4-bit hex digits. The number is represented as:

$$(-1)^s*F*16^{E-64}$$

In positive numbers, s=0, the exponent is normal, and the fraction is positive. Negative numbers are the 2's complement of the positive representation.

DEC Floating Point Format. Bit 15 is the sign bit s, with 0 indicating a positive number; 1, a negative number. The exponent E occupies bits 14-7, and is a power of 2 with a bias of 128. Bits 31-16 comprise the less significant bits, and bits 6-0 comprise the more significant bits of the fraction F, with a leading 1 implied. The number is represented:

$$(-1)s*(1.F)*(2^{E-128})$$

In positive numbers, s=0, the exponent is normal, and the fraction is positive. In negative numbers, s=1, the exponent is normal, and the fraction is positive.

Conceptual Background

The conceptual basis through which the implementation of the preferred embodiment may be more easily understood will now be presented. The IEEE-to-IBM format conversion will be described in detail. The principles behind the conversion from IEEE-to-SEL and IEEE-to-DEC formats will be described briefly, with reference to the more detailed IEEE-to-IBM conversion description which immediately follows.

IEEE-to-IBM Format Conversion Concepts. First, 127 is subtracted from the exponent. The difference is the power of 2 that the IEEE fraction F (bits 22-0, with hidden bit implied) is multiplied by to form the IEEE number.

The difference is divided by 4. The quotient comprises (1) an integer, and (2) a remainder which is a fraction of 4. This division by 4 is performed so as to allow conversion from IEEE's base 2 format to IBM's base 16 format.

The quotient integer thus corresponds to a power of 16 multiplier. The remainder of the division by 4 is a power of 2 which may be thought of as a fraction of a power of 16. The fraction corresponds to the amount of shifting which the fractional part of the IEEE number must undergo in order to compensate for the exponent's conversion from base 2 to base 16.

Because the IBM format specifies the number of the form $$0.F*16^n,$$

and IEEE format specifies a number of the form $$1.F*2^m,$$

the power of 16 must be increased by 1 in order to have a pure fraction (a fraction less than 1) preceding the multiplying factor $16^n$. (There must be a 0 to the left of the decimal point in the IBM format.)

Therefore, the integer result of the divide-by-four function must be increased by 1. But if the integer part is increased by 1 (=4/4), then the fractional remainder of the quotation must be decreased by 1 (=4/4).

This decrement of the remainder corresponds (in binary) to taking the 2's complement of the remainder. This correspondence is shown in the following Table I:

TABLE I

| Decimal # | Fractional 2's Complements | |
|---|---|---|
| | Binary | 2's Complement |
| 0 | 00 | 00 (φ) |
| 1 | 01 | 11 (3) |
| 2 | 10 | 10 (2) |
| 3 | 11 | 01 (1) |

A decimal mapping would be as follows:

| | | | | |
|---|---|---|---|---|
| φ | → | φ | | |
| 1 | → | 3 | | MAP #1 |
| 2 | → | 2 | | |
| 3 | → | 1 | | |

$2^{7/4}=2^{4/4}\cdot 2^{3/4}=2^{8/4}\cdot 2^{-1/4}$   3 → −1

$2^{6/4}=2^{4/4}\cdot 2^{2/4}=2^{8/4}\cdot 2^{-2/4}$   2 → −2   MAP #2

$2^{5/4}=2^{4/4}\cdot 2^{1/4}=2^{8/4}\cdot 2^{-3/4}$   1 → −3

TABLE I-continued $2^{4/4} = 2^{4/4} \cdot 2^{0/4} = 2^{8/4} \cdot 2^{-4/4}$  4=100  ϕ→ −4

Comparing the two maps above (1 & 2) one can see that decrementing the remainder corresponds to a 2's complement of the remainder. The minus sign denotes the direction of the shifting.

Two advantages are inherent:

(a) significance is shifted out of the LSB (least significant bit), not the MSB (most significant bit); and (b) the barrel shifter's control inputs are supposed to be in 2's complement form, so no additional circuitry is required.

The 2's complement of the fractional part of the divide-by-4 is used to control how many bits to shift the fractional part (bits 22-0) of the IEEE number.

For example, if the exponential quotient is 1.75 (7/4), then the following is true:

$$2^{7/4} = 2^{1\frac{3}{4}} = 2^{(4/4)} \cdot 2^{(\frac{3}{4})} = 2^{(8/4)} \cdot 2^{(-\frac{1}{4})}$$

The factors in the last product indicate the separation of the quotient into components related to powers of 16 ($2^{(8/4)}$) and a power of 2 decreased by 4/4 ($2^{(-1/4)}$).

It is noted that the introduction of a power of 2 with a negative exponent corresponds in hardware to a shift to the right, desirable because the least significant bits of the fraction are those which are shifted out during the conversion process. The 2's complement of the fractional remainder of the divide-by-4 quotient controls a shift register for the fraction. The shift register is advantageously a high-speed shift register, preferably a barrel shifter. The effect on the destination format word of the hidden (implied) bit from the IEEE format may be advantageously implemented using a programmable logic array (PLA) such as a Xilinx XC2018, described below, with special reference to FIG. 8.

The exponent of the (destination) IBM number is the integer portion of the divide-by-4 quotient, with 1 added to it, and then biased by 64 (resulting in an effective addition of 65 to the integer).

Finally, of course, the IBM word is assembled in bitwise order for eventual presentation to a destination device.

IEEE-to-SEL Format Conversion Concepts. The IEEE-to-SEL conversion is the same as the IEEE-to-IBM conversion, described above, with one notable exception. Negative numbers in the SEL format require that the output be in 2's complement notation. (In hardware, this is advantageously handled with fast adders.

IEEE-to-DEC Format Conversion Concepts. The IEEE-to-DEC conversion requires that the IEEE exponent be increased by 2. Also, the placement of the 16-bit words within the 32-bit field must be reversed.

Special Cases. Certain special cases are encountered in converting IEEE single precision floating point numbers. These special cases, and the way the preferred embodiment handles the special cases, are presented here.

If an infinity is encountered (expressed in the IEEE standard as an exponent of all 1's, with a 0 fraction), the output is clamped to the largest available positive (or negative) number available, corresponding to positive or negative infinity.

If an input (source) number is "not a number" (NAN) in the IEEE standard, with 1's in the exponent and a non-zero fraction, then these numbers are clamped in the same manner as infinities.

An IEEE 0 (with all 1's in the exponent, and all 1's in the fraction) is caused to be clamped to zero, but the sign bit carries through unchanged.

Denormalized numbers (having 0's in the exponent, and a non-zero fraction) are clamped in the same manner that zero numbers are processed.

In the particular case of a conversion involving the DEC format, the case where there is an exponent overflow causes the number to be clamped to its upper limit. (In the preferred embodiment, this scenario can be made to generate an interrupt signal to a microprocessor.)

Thus, according to a preferred embodiment of the present invention, a method for converting a source-format floating point number to a destination-format floating point number, may comprise the steps of receiving the source-format floating point number, the source-format floating point number comprising at least a fraction or mantissa, and an exponent; determining an intermediate exponent, based on the exponent of the source-format floating point number and on the destination format, so as to produce a shift position control signal; shifting the fraction or mantissa in a barrel shifter zero or more bit positions in accordance with the shift position control signal so as to produce an intermediate fraction or mantissa; and formatting the intermediate fraction or mantissa, and the intermediate exponent, into the destination-format floating point number. The determining step may comprise dividing the exponent of the source-format floating point number by a first number, in which the first number is related to the logarithm, to the base of the source-format floating point number's exponent, of the base of the destination-format floating point number's exponent, this dividing step producing a quotient comprising an integer and a remainder; subtracting a second number from the remainder in accordance with the destination format to produce an adjusted remainder; adjusting the value of said integer to compensate for the subtracting step; outputting the shift position control signal in accordance with the adjusted remainder; and outputting the intermediate exponent in accordance with the value of the integer

Preferred Hardware Implementation

Figure 2:
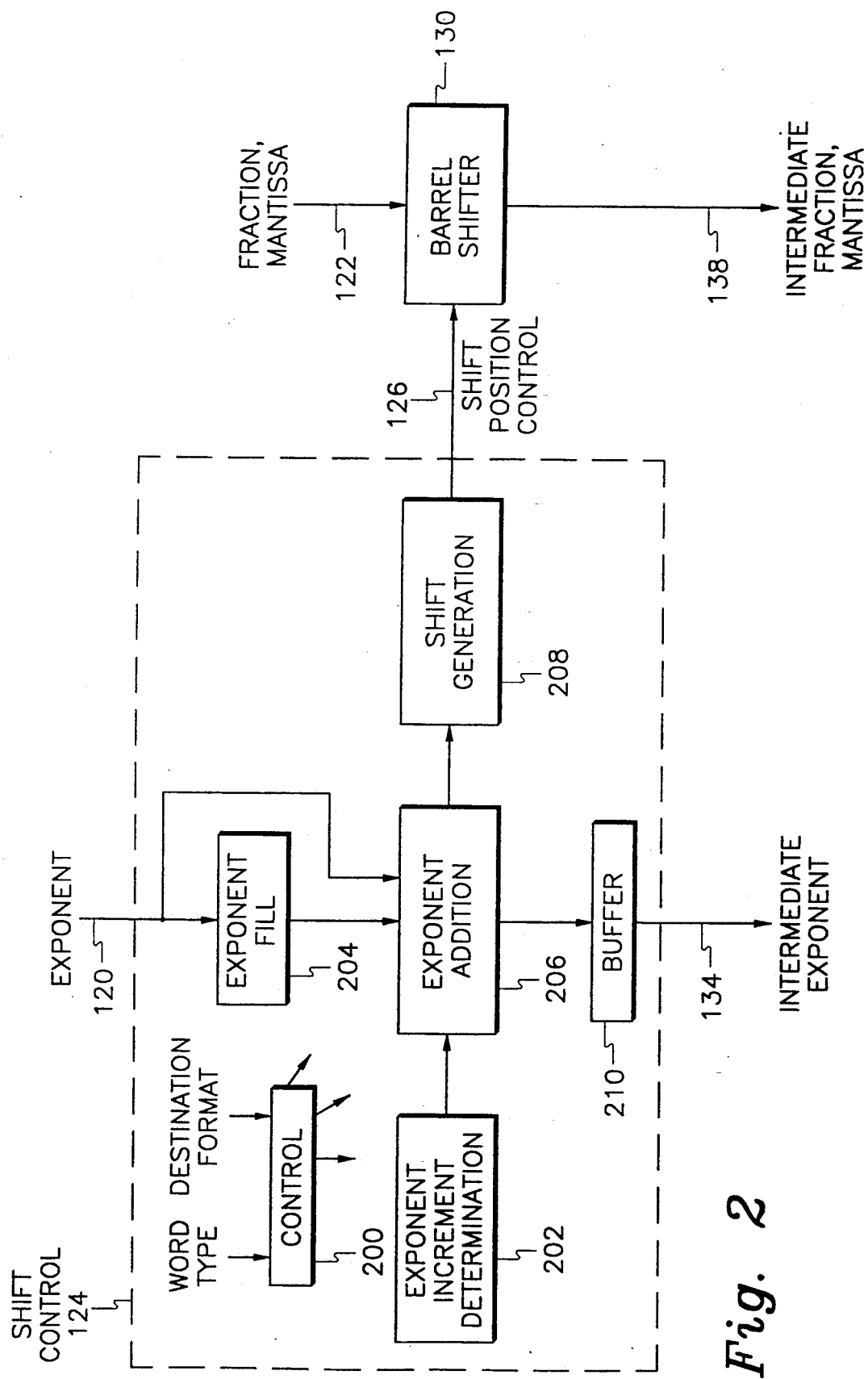
FIG. 2 is an intermediate-level block diagram of the preferred embodiment of shift control block 124 and barrel shifter 130 shown in FIG. 1.

Referring to FIG. 1, a high-level block diagram of a portion of a parallel output module incorporating an implementation of the floating point converter according to the preferred embodiment of the present invention is illustrated. FIG. 2 (described below) presents an intermediate-level block diagram of shift control block 124, and FIGS. 3-9 present on a more detailed level the preferred implementation of the shift control block 124, barrel shifter 130, and the format conversion units 150, 160, 170, and 180.

The principles described above, in the section entitled "Conceptual Background", are presently preferred to be implemented as described in the present section, "Preferred Hardware Implementation". However, the innovative teachings of the present invention are not limited to the particular configurations described in detail below. Rather, they are to be limited only in accordance with the various claims which follow this Specification.

Referring generally to FIG. 1, various means may be used to control the operation of the registers, logic, and other components of the system. For example, a discrete-component microsequencer operating on a high-speed (for example, 80 ns) instruction cycle using custom-designed microcode may be employed. Discrete component microsequencers offer the advantage of speed which render more general purpose processors less desirable, although very high speed bit slice processors (such as the ADSP 3210-3220 or ADSP 1401-1410 from Analog Devices Corporation of Norwood, MA) would suffice in many applications, cost and speed requirements permitting. Furthermore, it is possible to use other control means, such as discrete logic timing chains, for example, to effectuate the same control functions, and still lie within the spirit and scope of the present invention.

Because the implementation of the control functions lies within the ability of one skilled in the art to practice, given the foregoing and following description, the control features are not shown explicitly in the drawings, although the presence of such a control function in the preferred embodiment is understood by those skilled in the art.

In FIG. 1 the source word (such as an IEEE floating point format number) enters at the top of the diagram at 102. The converted (destination) word (such as an IBM, SEL, or DEC floating point format word) exits at the bottom of the diagram at 195. The floating point conversion process, and the selection of the format into which the source word is converted, is performed within the circuitry shown in FIG. 1.

The source word enters along path 102 to be registered in a register 106. In the preferred embodiment, this is a first-in, first-out (FIFO) register. Of course, depending on the particular application, the input path may be any which is desirable, based on considerations known to those skilled in the art. The sign of the source word is resident in portion 110 of register 106. The exponent of the source word is resident in section 112 of register 106. Finally, the fraction (for IEEE-format words) or mantissa for numbers of different formats, is resident in section 114 of register 106.

In a path parallel to the source data word itself are the command, tag, and index bits which enter along path 104. These bits are registered in command register 108.

Returning to discussion of the main data flow, the sign, exponent, and fraction bits of the source data word are output from register 106 onto paths 116, 120, and 122. In the case of IEEE-format floating point words, fraction path 122 comprises 23 bit paths; exponent path 120 comprises 8 bit lines; and sign bit path 116/117/118 comprises a single bit line.

The fraction is input from path 122 to a shift register 130. Advantageously, shift register 130 is a barrel shifter in the preferred embodiment. The exponent and sign bits are input to shift control logic block 124 along respective paths 120 and 118. Shift control logic block 124 will be described in greater detail below, with special reference to FIGS. 2-5.

First, the destination word type is determined. Certain bits within the command word resident in register 108 define whether the floating point conversion is to be to the IBM, DEC, or SEL format, or even whether there is to be a conversion at all. In the preferred embodiment, number conversions are performed only on single precision floating point words, but only because of particular constraints imposed on it by its placement in a particular product called a parallel output module (POM) board. It lies well within the contemplation of the invention that conversions occur in many circumstances on other than single precision floating point words, such as, for example, those involving double precision floating point formats.

Shift control logic block 124 acts upon the exponent in accordance with principles described above, in the Conceptual Background section. A shift control logic block outputs shift position control logic signals along path 126 to a shift control input to barrel shifter 130. Barrel shifter 130 comprises greater than 23 bits so as to accommodate the shifting of the IEEE fraction. The shift position control signal from shift control logic block 124 determines how many bits, if any, the fraction should be shifted. The number of bits depends on the remainder of the divide-by-4 operation, described above. It is also dependent on the destination format, since the destination format often has a base different than that of the source format.

Shift control logic block 124 also calculates the value of the destination exponent. For the IEEE-to-IBM conversion, 127 is subtracted from the source IEEE exponent. The difference is divided by 4, and the quotient then incremented by 64. The IEEE-to-SEL conversion causes the same calculations as the IEEE-to-IBM conversion. For the IEEE-to-DEC conversion, 2 is added to the exponent to form the destination DEC exponent. If no conversion is chosen, the exponent is of course unchanged by shift control block 124.

The destination exponent is output on path 134. In the preferred embodiment, the path 134 comprises 8 bits, but only because that is the maximum number of exponent bits present in the conceivable destination formats (limited in the preferred embodiment to IBM, DEC, and SEL formats). However, it is clear that, depending on the particular destination formats which might be anticipated, the size of path 134 is adjusted in accordance with principles understood by those skilled in the art, while still remaining within the contemplation of the present invention. Similarly, the shifted fraction (or mantissa) of the source word is output from barrel shifter 130 along a path 138 which comprises 23 bits in the preferred embodiment. The size of this path 138 is determined in a manner analogous to that of path 134.

The shifted fraction, the newly calculated exponent, and the sign bit are sent along respective paths 138, 134, and 117 to respective fan-out paths 139, 135, and 119. The fraction, exponent, and sign bits are input to the fraction, exponent, and sign inputs of one or more format conversion units. There is one format conversion unit for each possible destination format. In the preferred embodiment, format conversion units are shown for cases when there is to be no conversion (150), for conversion to the DEC format (160), to the IBM format (170), and to the SEL format (180). In the preferred embodiment, the format conversion units comprise programmable logic arrays (PLA's; also "programmable gate arrays"). Briefly, the PLA's perform the function of organizing the portions of the destination floating point word into proper order.

In the case where no conversion is to take place, the format conversion unit 150 is configured as a flow-through buffer which presents a floating point word in the source format along path 151 to a bus 190.

If the destination format is DEC format, the source IEEE word must have its lower and upper 16-bit components switched to match the DEC format. PLA 160 performs this switch. PLA 160 also handles the number conversion overflows with internal clamping circuits. PLA 160 deals with IEEE infinities in the manner described above, in the section entitled Conceptual Background.

If the destination format is IBM format, PLA 170 produces an IBM format word on path 171 after having inserted the "hidden" bit which is implied by normalization in the IEEE format.

If the destination format is the SEL format, PLA 180 performs the same functions as described immediately above, with respect to the IBM PLA 170, and outputs a SEL-format number on path 181. However, if the result of the conversion is a negative number, then the number output on path 181 is converted to a 2's complement number by block 182.

Paths 151, 161, 171, and 183 are connected to a common bus 190. Whichever of the four PLA's are activated to produce a floating point word of the desired destination format takes control of the bus 190 so as to selectively allow the proper destination word to pass along path 191 to an output register 192. Then, depending on the application, the destination-format floating point word may be sent to circuitry such as buffer drivers 194 to exit the board for another destination, such as another piece of data processing equipment.

Of course, it is understood that a bus arrangement is but the preferred embodiment of a means of selecting the output of one of the format conversion PLA's 150, 160, 170, or 180. Other means of selecting the proper output, such as a multiplexer controlled by one or more bits originating from command register 108, lie within the contemplation of the present invention, and within the ability of those skilled in the art.

Referring again to the top of FIG. 1, command word register 108 contains the command, tag, and index information which has contents and uses which vary with the particular application. In the preferred embodiment of the present invention, in which the floating point conversion hardware is used on a parallel output module (POM), the command register comprises the following components. However, it is to be understood that these components are exemplary, and are presented here in an exemplary environment in which the claimed invention may operate. Variations and modifications of this command word lie within the contemplation of the present invention and within the ability of one skilled in the art.

In the preferred embodiment, certain bits are dedicated to indicating the desired destination format for a particular IEEE word being input to register 106 at a time corresponding to one or more particular command words at register 108.

The tag information is advantageously used to label (or "tag") certain IEEE words to uniquely identify the word and thus give it significance in a data stream comprised of many different kinds of data. This tag information feature is particularly useful when the conversion device is employed in larger systems such as telemetry systems.

The index information can be used to identify a word in a current value table (CVT) for use when the conversion device is employed, for example, in a real time telemetry display.

The command word contains information which allows selection of whether or not a conversion will be performed on a particular floating point word by selecting single precision (which undergoes conversion in the preferred embodiment, used on the POM board), double precision (passed through without conversion) or integer (also not converted).

The command word passes along path 109 to buffer block 196 in a fashion parallel to the conversion of the data word which began along path 102 and ending on path 195. Block 196 is an example of a way to ensure correlation between data words in the main data flow path and the command word path.

Finally, the command word which is to accompany the destination-format floating point word on path 195 is sent to buffer driver 198 so that it can be output along path 199.

FIG. 2

FIG. 2 illustrates in greater detail than FIG. 1 the components of the shift control block 124.

It is be understood that FIG. 2 is an intermediate-level block diagram which might be of some use in understanding the details which are presented below, with reference to FIGS. 3-9. Certain connections have been omitted in FIG. 2 for purposes of clarity. It is to be understood that variations of the functions and interconnections shown in FIG. 2 may be made, while still lying within the scope of the present invention as defined by the appended claims.

Within shift control block 124 is an internal control block 200. Internal control block 200 receives a word type designator and a destination format specification from the command register 108 (FIG. 1). The internal control block 200 generates various control signals to control other elements of the shift control block 124. Generally, the internal control block serves to activate or deactivate certain paths of the other elements, depending on whether a conversion is to take place at all, and if a conversion is to take, what the destination format is to be. Internal control block 200 is described in greater detail below, with reference to FIG. 3.

Element 204 indicates an exponent fill block which receives the exponent from the source-format floating point word along path 120. The exponent fill block 204 generates control signals for ensuring meaningful results when certain conversions result in special cases such as values of floating point numbers beyond the range of representation for a given format (infinities). The exponent fill block 204 is described in greater detail below, with reference to FIG. 4.

Element 202 indicates the exponent increment determination block. The exponent increment determination block 202 determines, based on information from internal control block 200, what number should be added to the exponent 120 from the source-format floating point word. The exponent increment determination block 202 is described in greater detail below, with reference to FIG. 3.

The exponent addition block 206 receives the source-format exponent along path 120, certain control signals from the exponent fill block 204, and a chosen set of exponent increment(s) from exponent determination block 202. The exponent addition block performs the actual addition (if appropriate) of the exponent and the proper increment. Exponent addition block 206 is described in greater detail below, with reference to FIG. 5.

Shift generation block 208 receives information from the exponent addition block 206 and generates a shift position control word along path 126 to be input to the shift position control input of barrel shifter 130. The shift generation block 208 is described in greater detail below, with reference to FIG. 5.

A buffer 210 receives a summed exponent value from exponent addition block 206 and outputs the intermediate exponent along path 134. A preferred implementation of buffer 210 is described in greater detail below, with reference to FIG. 5.

The barrel shifter 130 receives the fraction or mantissa of source-format floating point word along path 122, and outputs the intermediate fraction or mantissa along path 138 to the format conversion units. The barrel shifter is described in greater detail below, with reference to FIG. 6.

FIG. 3

Figure 3:
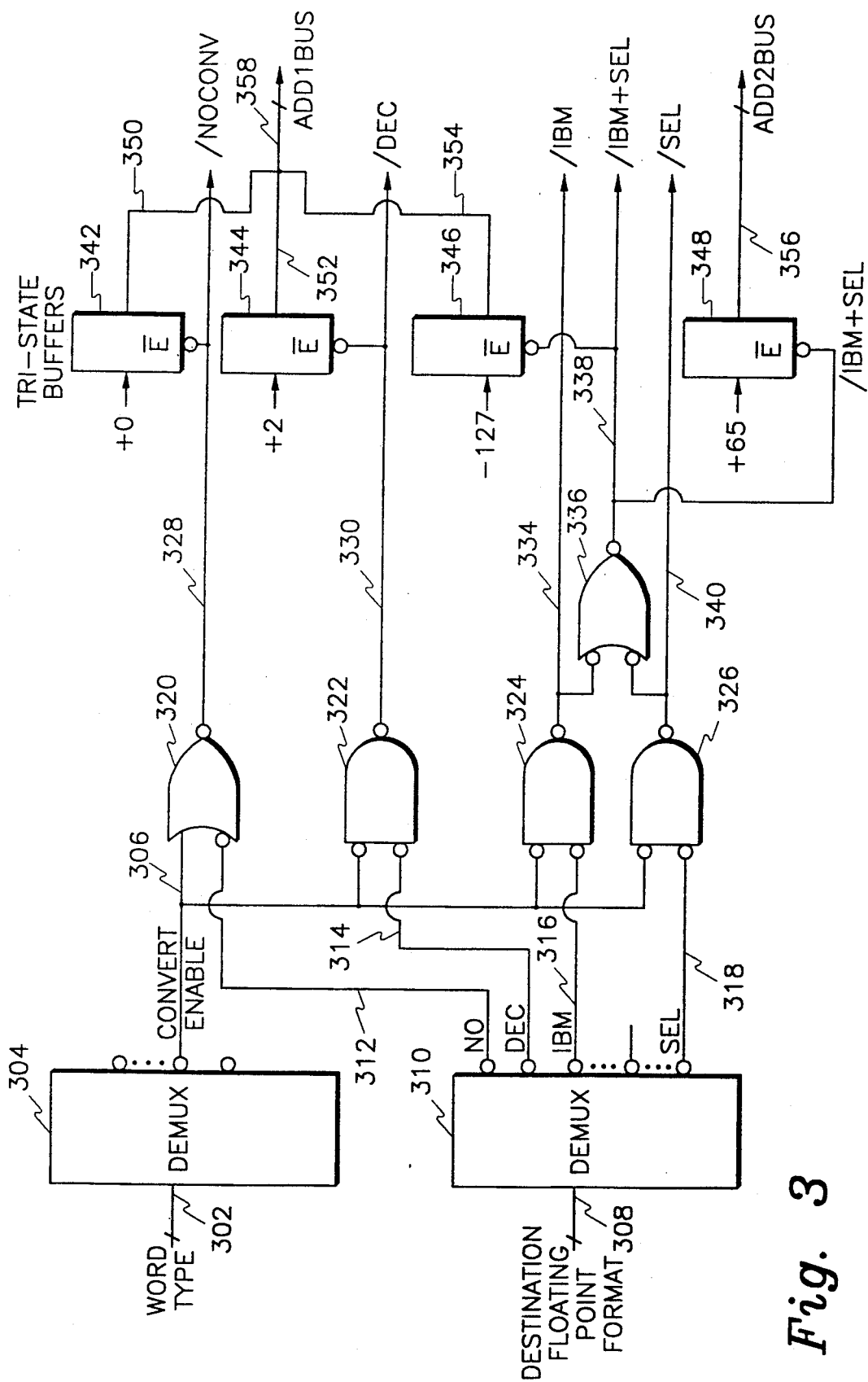
FIG. 3 is a diagram of a preferred embodiment of the internal control block 200 and exponent increment determination circuits 202 (FIG. 2) within the shift control block 124 (FIG. 1)

FIG. 3 illustrates the preferred implementation of the exponent increment determination and word type determination logic.

Along path 302 is input a Word Type designator. The word type designator originates in the Command Register 108 (FIG. 1). The word type designator is input to a demultiplexing circuit 304. If the word type designator is of such a value that a conversion is desirable, then a Convert Enable signal is activated on path 306. An activated Convert Enable signal on path 306 enables production of various control signals 330, 334, 338, and 340 when a conversion process is to occur.

In the preferred embodiment, when the floating point conversion device is to be used in a Parallel Output Module (POM), the word type input along path 302 is a 3-bit signal. Different values of the word type designator indicate the word type, such as IEEE integer, single-precision IEEE floating point, or double-precision IEEE floating point. In one preferred embodiment, number conversion is performed only on single-precision IEEE floating-point format numbers. The integer and double-precision IEEE floating-point formats pass through the floating point conversion device without conversion in the embodiment useful on the POM unit.

Thus, in this particular nonlimiting example, when a single-precision IEEE floating point number is indicated by word type designator along path 302, then the Convert Enable signal along path 306 is activated. In the illustration shown in FIG. 3, convert enable is shown as an active low signal. Of course, various modifications of the word type-triggered Convert Enable signal lie within the contemplation of the present invention. FIG. 3 illustrates one exemplary embodiment.

Referring now to the path 308 in FIG. 3, a Destination Floating Point Format designator is input to a demultiplexer 310. Advantageously, in the case in which embodiments of the present invention are employed in a Parallel Output Module (POM), the Destination Floating Point Format designator may be input to a setup register at setup time by the system CPU. In the preferred embodiment, in which the floating point conversion device is resident within a Parallel Output Module, the destination floating point formats include the DEC, IBM and SEL formats. The value of the Destination Floating Point Format designator on input path 308 determines which one of the outputs of the multiplexer 310 is activated.

More specifically, if no format conversion is to take place (so that the output word is in the same format as the input word), then the NO signal on path 312 output from demultiplexer 310 is activated. If the destination floating point format is the DEC format, then the DEC output is activated on path 314. Similarly, if the destination floating format is the IBM (or SEL) format, then the IBM (or SEL) signal on path 316 (or 318) is activated. The invention contemplates additional, or different, destination floating point formats, so that demultiplexer 310 may have additional outputs to enable appropriate portions of the conversion device.

Each of paths 312, 314, 316 and 318 are input to respective gates 320, 322, 324 and 326 (which are illustrated as having active-low inputs). The Convert Enable signal along path 306 is input to a remaining active-low input of each of the NAND gates 322, 324, and 326, as well as to an active high input of NOR gate 320. The NAND gates 322, 324 and 326 generate respective /DEC, /IBM and /DEC control signals on paths 330, 334 and 340.

A NOR gate 336 (illustrated as having active-low inputs) receives the active-low outputs 334 and 340 from respective gates 324 and 326. The output of gate 336 is activated when either of gates 324 or 326 is activated. That is, the output of gate 336 is activated when the destination floating point format is either the IBM or SEL format.

Also illustrated in FIG. 3 are four tri-state buffers 342, 344, 346, and 348. One or more of these tri-state buffers may be activated. The choice of which of the buffers are activated depends on whether a conversion is to take place, and on the destination type of the conversion. If no conversion is to take place, then tri-state buffer 342 outputs a value of "0" along path 350. The output of this value "0" is enabled by the output of gate 320 along path 328. Tri-state buffer 342 is thus activated when Convert Enable is not activated, or the "NO" signal is activated. The signal output on path 328 from gate 320 is designated /NOCONV and is used also below, as described with respect to the buffer for the "no conversion" path in FIG. 6.

When both the Convert Enable signal on path 306 and the DEC signal on path 314 are active, then gate 322 outputs an active /DEC signal along path 330. The /DEC signal enables tri-state buffer 344 to output a value "+2" along path 352.

When the Convert Enable signal along path 306 is active, and either of the IBM or SEL signals along respective paths 316 or 318 are active, then gates 324, 326 and 336 produce an active /IBM+SEL signal along path 338 which enables both tri-state buffers 346 and 348. When tri-state buffer 346 is activated, it outputs a value of −127 along path 354. When tri-state buffer 348 is activated, it outputs a value of +65 along path 356.

Because of the nature of the gating arrangement comprising gates 320, 322, 324, 326, and 336 described above, only one of tri-state buffers 342, 344, or 346 should have its respective output enabled at any one time. Thus, respective buffer output paths 350, 352, and 354 may be safely wired together to form a path designated in FIG. 3 as ADD1BUS 358.

ADD1BUS (produced by an activated one of buffers 342, 344, and 346) takes on the value +2 for a conversion to the DEC format, and a value of −127 (base 10) for conversion to the IBM or SEL destination formats. ADD2BUS (produced by buffer 348 when activated) is not active for conversion to the DEC format, but takes on the value of 65 for conversion to the IBM or SEL destination formats.

If no conversion is to take place, then the ADD1BUS takes on the value of 0 and the ADD2BUS is inactive.

The ADD1BUS signal 358 is used in the exponent addition logic described below, with reference to FIG. 5. Similarly, the ADD2BUS value +65 which is output along path 356 is also involved in the FIG. 5 exponent addition logic.

At a more conceptual level, the values ADD1BUS and ADD2BUS output on paths 358 and 356, respectively, represent the numbers to be added and/or subtracted from the exponent of the source format floating point word to arrive at the proper exponent for the destination-format floating point word.

Multiplexers 304 and 310 may be configured as 74F138 demultiplexers, available from any of a variety of vendors, such as Texas instruments, Inc., Signetics, Motorola, and so forth. The "74F" series was chosen for the environment of the preferred embodiment to gain the benefit of high data rates, but other logic families (such as the LS, ALS, AS families) could also be used, provided other design constraints (such as power consumption) allowed it. Gates 320, 322, 324, 326, and 336 may comprise 74F00, with 74F08, 74F32, and 74F08, also available from the same vendor. Tri-state buffers may be 74F541 buffers, also available from the same vender. Of course, the particular choice of components may be varied in these circuits and others in this Specification, while still remaining within the scope of the present invention.

FIG. 4

Figure 4:
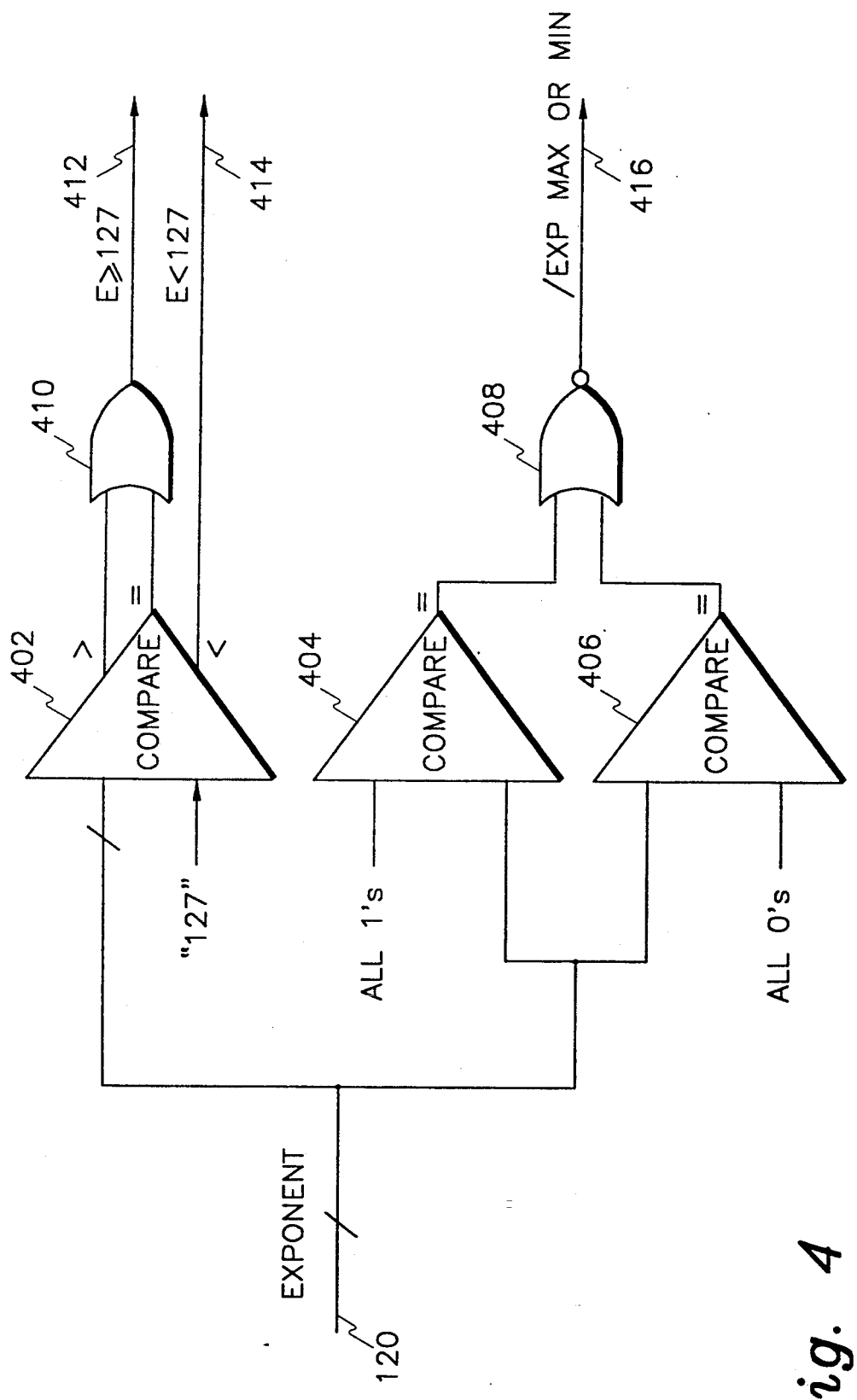
FIG. 4 is a diagram of a preferred embodiment of the exponent fill logic within the shift control block 124 (FIG. 1), which creates control signals for use in special cases, such as when an exponent must be clamped.

Referring now to FIG. 4, the source-format floating point word's exponent on path 120 is input to two circuits.

The first circuit comprises a comparator 402 having a second input receiving a binary representation of 127 (base 10). The ">" and "=" outputs of comparator 402 are indicated as input to OR gate 410. The output 412 of OR gate 410 is thus activated when the exponent E is greater than or equal to 127. The "<" output of comparator 402 is activated when the exponent is less than 127.

This top circuit in FIG. 4 is useful during the conversion from IEEE to either the IBM or SEL formats. The "E<127" signal 414 is used to fill the two most significant bits of one input of a second-stage adder shown in FIG. 5, described below. (The "E≧127" signal 412 is not used in the environment of the present embodiment, but the signal is available for flexibility in designing other conversion schemes.)

Referring to the bottom portion of FIG. 4, a second circuit is illustrated.

The first-format floating point word's exponent enters along path 120 (also illustrated in FIG. 1) to be input to each of comparators 404 and 406. Comparator 404 has its opposite input held to an "all-1's" state. The opposite input of comparator 406 is held to an "all-0's" state. The "=" outputs of comparators 404 and 406 are input to NOR gate 408. NOR gate 408 produces an active-low signal along path 416 which is also indicated as /EXP MAXORMIN.

In the configuration shown in FIG. 4, the output signal /EXP MAXORMIN 416 is active when the source-format floating point word's exponent is either in an all-1 or an all-0 state. Upon the production of the /EXP MAXORMIN signal 416, the output floating point number will be clamped to a certain number, depending on the destination floating point format which is selected by destination floating point format designator on path 308 (FIG. 3). The /EXP MAXORMIN signal 416 is input to the format conversion units 170 and 180 (FIG. 1) which are used for conversion to the IBM or to the SEL formats. The specific use of the /EXP MAXORMIN signal 416 will be described in greater detail below, with respect to FIG. 8.

The top circuit of FIG. 4 may comprise a set of three 74F85 comparators arranged in a first level of two comparators and a second level of the third comparator. A first level of two comparators may receive the four least, and four most, significant bits of the source-format floating point word in their respective A inputs. The B inputs of the 74F85 comparators may receive the nibbles 0111 and 1111. The "B>A", "A=B" and "A>B" inputs of the first and second comparators receive constant values of 0, 1, and 0, respectively.

The "B>A" output of the more significant comparator may be input to the least significant bit of the B input of the third of the three comparators. The "A>B" output of the more significant comparator may be input to the least significant bit input of the third comparator's A input. The three more significant bits of the A and B inputs of the third comparator may be tied to 0. The "B>A", "A=B", and "A>B" outputs of the second (less significant) comparator may be tied to respective identically named inputs of the third comparator.

In this manner, the "B>A" signal comprises the "E<127" signal which has been referred to above on a more functional level.

The 74F85 comparators may be obtained from a variety of vendors, such as those listed above.

Similarly, the configuration which is schematically indicated at the bottom of FIG. 4 as comparators 404 and 406 feeding a NOR gate 408 may be implemented as a 74F521 identity comparator, available from a variety of vendors, such as those listed above. The source-format floating point word's exponent is fed into the A input of the 74F521. The least significant bit of the exponent is fed into the four most significant bits of the B input. The second least significant bit of the exponent is fed into the four least significant bits of the B input of the identity comparator. The "A=B" input is tied low. The "A=B" output thus comprises the /EXP MAXORMIN output signal 416 referred to above on a more conceptual level.

As with any of the circuits described in block diagram form or in terms of implementation with particular chip types, variations may be made by those skilled in the art while remaining within the scope of the present invention as defined by the appended claims.

FIG. 5

Figure 5:
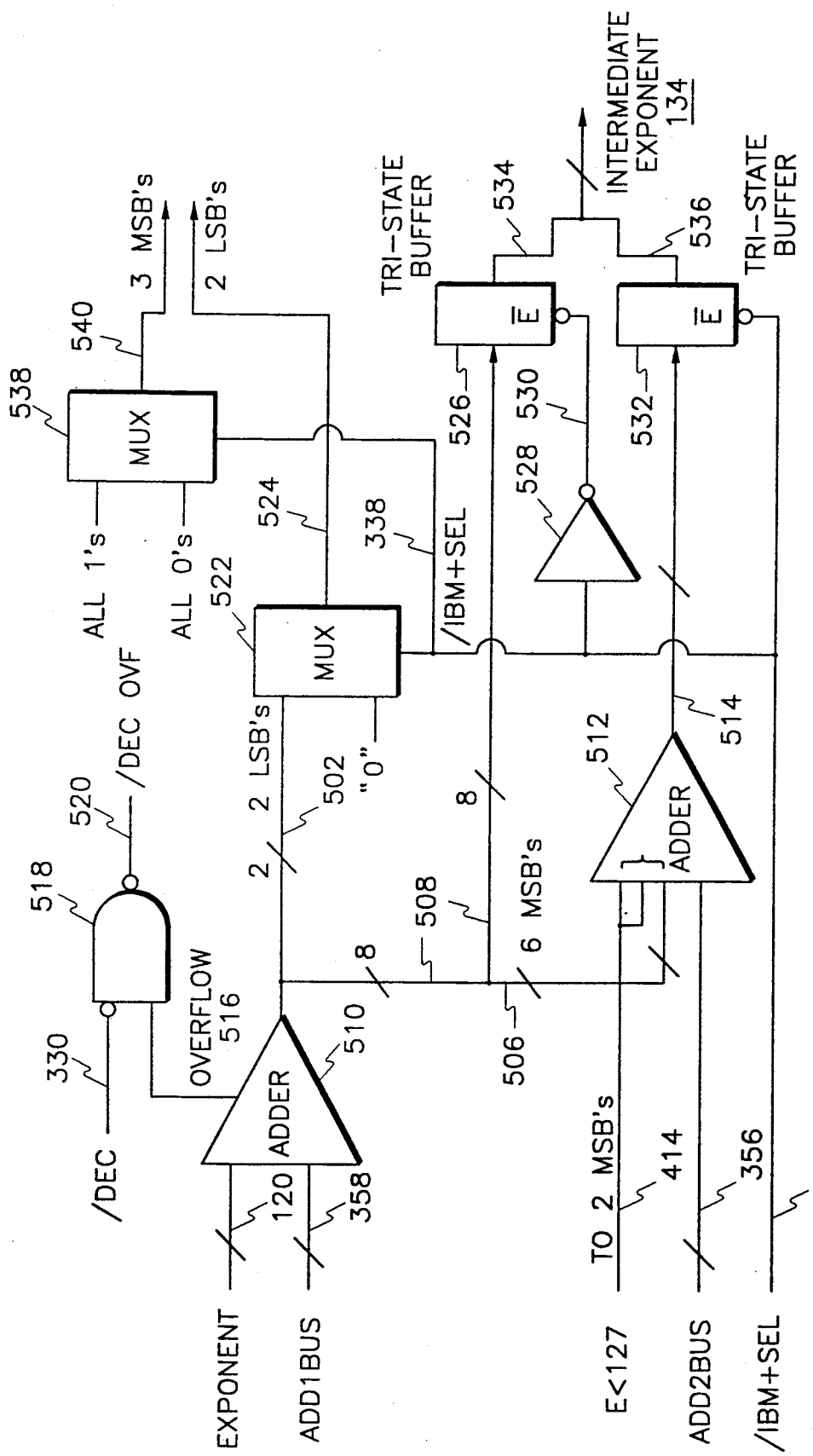
FIG. 5 is a diagram of the preferred embodiment of the exponent addition and shift generation logic 206 and 208 (FIG. 2) within the shift control block 124 (FIG. 1)

Referring to FIG. 5, the exponent addition logic and shift position control generation logic according to the preferred embodiment are illustrated.

Briefly, FIG. 5 may be summarized as a 2-stage adder assembly comprising adders 510 and 512. The two least significant bits output from adder 510 are input to a multiplexer so as to selectively comprise the two least significant bits of shift position control word 542. In parallel with this operation, the intermediate exponent 134 is generated through a selection of either the output of adder 510 or the adder 512, depending on whether the /IBM+SEL signal 338 (from FIG. 3) is inactive or active.

Looking in more detail at FIG. 5, the inputs to adder 510 comprise the source-format floating point word's exponent input along path 120, as well as the ADD1BUS signal 358 (from FIG. 3). Adder 510 adds the exponent to the increment. Adder 510 outputs this sum, which constitutes the destination-format floating point word's exponent, provided the conversion is not to the IBM or SEL formats.

In the event that the addition of the exponent on path 120 and the ADD1BUS on path 358 results in an overflow condition, overflow bit 516 is activated. Overflow bit 516 is input to a NAND gate 518 whose other input receives the /DEC signal along path 330 (FIG. 3). Here, the input for the /DEC signal 330 is active low. When the overflow condition coincides with a conversion to the DEC format, the output of NAND gate 518 becomes active, outputting a /DEC OVF signal 520 to format conversion unit 160 (FIG. 1). This /DEC OVF signal is involved in the format conversion when the destination format is the DEC format. The /DEC OVF signal causes the number to be clamped to the highest /DEC number in the DEC format conversion unit. This DEC format conversion process will be described below, with respect to FIG. 7.

Returning to FIG. 5, the two least significant bits 502 which are output in the sum 508 of adder 510 are input to a multiplexer 522. The opposite input of the multiplexer is set to "0". The multiplexer 522 is controlled by the /IBM+SEL signal 338 (FIG. 3). Thus, when the conversion is to the IBM or SEL formats, the two least significant bits are selected to pass through to the multiplexer output on path 524. However, when the conversion is not to an IBM or SEL format (such as to the DEC format), multiplexer 522 outputs 00 along its output path 524.

In either case, output 524 comprises the least two significant bits of shift position control word 542. Shift position control word 542 is input to the shift position control inputs of barrel shifter 602, described below, with reference to FIG. 6. The shift position control word 542 is also input to the IBM and SEL format conversion units 170 and 180 (FIG. 1), also described below, with reference to FIG. 8.

Returning to FIG. 5, a multiplexer 538 has a first input set at an all-1 value, and its second input set at an all-0 value. The select input of the multiplexer 538 is controlled by the /IBM+SEL control signal 338 (FIG. 3). Thus, when the format conversion is to the IBM or SEL format, then multiplexer 538 outputs all-1's along its output path 540. Conversely, when the format conversion is to a format other than IBM or SEL (such as DEC), all-0's are output from the multiplexer 538 along its output path 540. In either event, the multiplexer output 540 comprise the three most significant bits of shift position control word 542.

Thus, a shift position control word comprises all 0's if the conversion is to formats other than the IBM or SEL formats (such as DEC). The shift position control word comprises the less significant bits of the "exponent plus ADD1BUS" addition (with all-1's filled in the most significant bits) if the conversion is to the IBM or SEL formats. Variations of the implementation of the formation of the shift position control word lie within the contemplation of the present invention, especially when conversions are to formats having exponents other than those explicitly considered here. In such cases, formation of the shift position control word may vary.

Referring to the lower portion of FIG. 5, the generation of the intermediate exponent 134 will now be described.

The second stage adder 512 addition adds a bias of 65 when the conversion is to the IBM or SEL formats. The second stage adder 512 receives various bits of its first input from several sources. The two most significant bits of the first input of the second-stage adder 512 come from the signal "E<127" 414 (FIG. 4). The two bits which fill the two most significant bits of the first adder input are the two most significant bits of the word to which 65 is added.

After the first addition (in adder 510) in which $127_{10}$ is subtracted from the exponent 120 (again, assuming conversion to IBM or SEL), the two least significant bits 502 are stripped off and used to control the barrel shifter through shift position control word 542, as described above. The remaining (here, six) most significant bits 506 are input to the six least significant bits of the first input to adder 512. The pre-bias exponent (the first input to adder 512) thus comprises the six most significant bits resulting from the first addition from adder 510 filled with duplicated "E<127" signal 414 from FIG. 4.

The second input to second-stage adder 512 is the ADD2BUS 356 (from FIG. 3). As described above, with respect to FIG. 3, ADD2BUS has the value +65 when the conversion is to the IBM or SEL formats. Thus, when the conversion is to the IBM or SEL formats, adder 512 adds the "pre-bias" exponent to 65 to generate the IBM or SEL format's exponent on its output path 514.

Tri-state buffers 526 and 532 receive their respective inputs from adders 510 and 512. Only one of the two tri-state buffers 526 and 532 may be active at one time. The choice of which of the two tri-state buffers is active is determined by the /IBM+SEL signal 338 (from FIG. 3). The /IBM+SEL signal is directly input to the active-low input to tri-state buffer 532 so that its output passes the output of adder 512 to buffer output 536 when the conversion is to the IBM or SEL formats. In this case, an inverter 528 which receives the /IBM+SEL signal 338 inverts the signal to disable tri-state buffer 526. The respective outputs 534 and 536 of tri-state buffers 526 and 532 are wired together so as to produce intermediate exponent 134. When the /IBM+SEL signal is active, then tri-state buffer 532 thus generates the intermediate exponent 134.

In contrast, when the format conversion is not to the IBM or to the SEL format, then the /IBM+SEL signal 338 is inactive. If the /IBM+SEL signal 338 is inactive, then tri-state buffer 532 is disabled, but tri-state buffer 526 is enabled through the inverted /IBM+SEL signal at inverter 528's output path 530. In this case, the output 534 of tri-state buffer 526 is enabled to present sum 508 as intermediate exponent 134. Intermediate exponent 134 is thus the output of adder 510 in cases when the format conversion is not to the IBM or SEL formats.

The intermediate exponent 134 is sent to all the format conversion units 150, 160, 170, and 180. These units are described in greater detail below, with reference to FIGS. 6, 7 and 8.

If no conversion is to take place, a zero will be added to the exponent in adder 510. Effectively, the exponent will pass through circuitry of FIG. 5 unchanged.

FIG. 5 is schematic in nature, and may be implemented in a variety of ways. In the preferred embodiment, adder 510 comprises 74F283 adder chips, available from a variety of vendors, including those listed above. The 8-bit exponent may be input to the respective 4-bit A inputs of the two adder chips. The 8-bit ADD1BUS signal 358 may be input to the two 4-bit B inputs of the adders. In the normal manner for using the 74F283 adders, the carry-out output of the less significant adder is input to the carry-in input of the more significant adder. The carry-out output of the more significant adder comprises the overflow bit 516.

The two multiplexers 522 and 532 may comprise 74F157 multiplexers. The A0 and A1 inputs of multiplexer 522 may be connected to the two least significant outputs of the adder 510 just described, with all other inputs being connected to the 0 voltage level.

Multiplexer 538 may have its A0, A1, and A2 inputs connected to a high voltage level, with all other data inputs (A3 and B inputs) connected to a zero voltage level. A select input of both multiplexers 522 and 538 is connected to the /IBM+SEL control signal 338.

Adder 512 may comprise two 74F283 fast adders. The six most significant bits from the adder 510 may be connected to the A1 and A0 inputs of the more significant adder chip within 512 and to the A0–A3 inputs for the less significant 74F283 chip within 512. Inputs A2 and A3 of the more significant chip are both connected to the "E<127" signal 414 from FIG. 4. The B inputs of both chips are connected to the ADD2BUS 356 from FIG. 3.

The tri-state buffers 526 may comprise 74F541 buffers respectively connected to the 8-bit outputs from the 74F283 chip outputs comprising adders 510 and 512, respectively. The inverter function may be implemented using a 74F00.

FIG. 6

Figure 6:
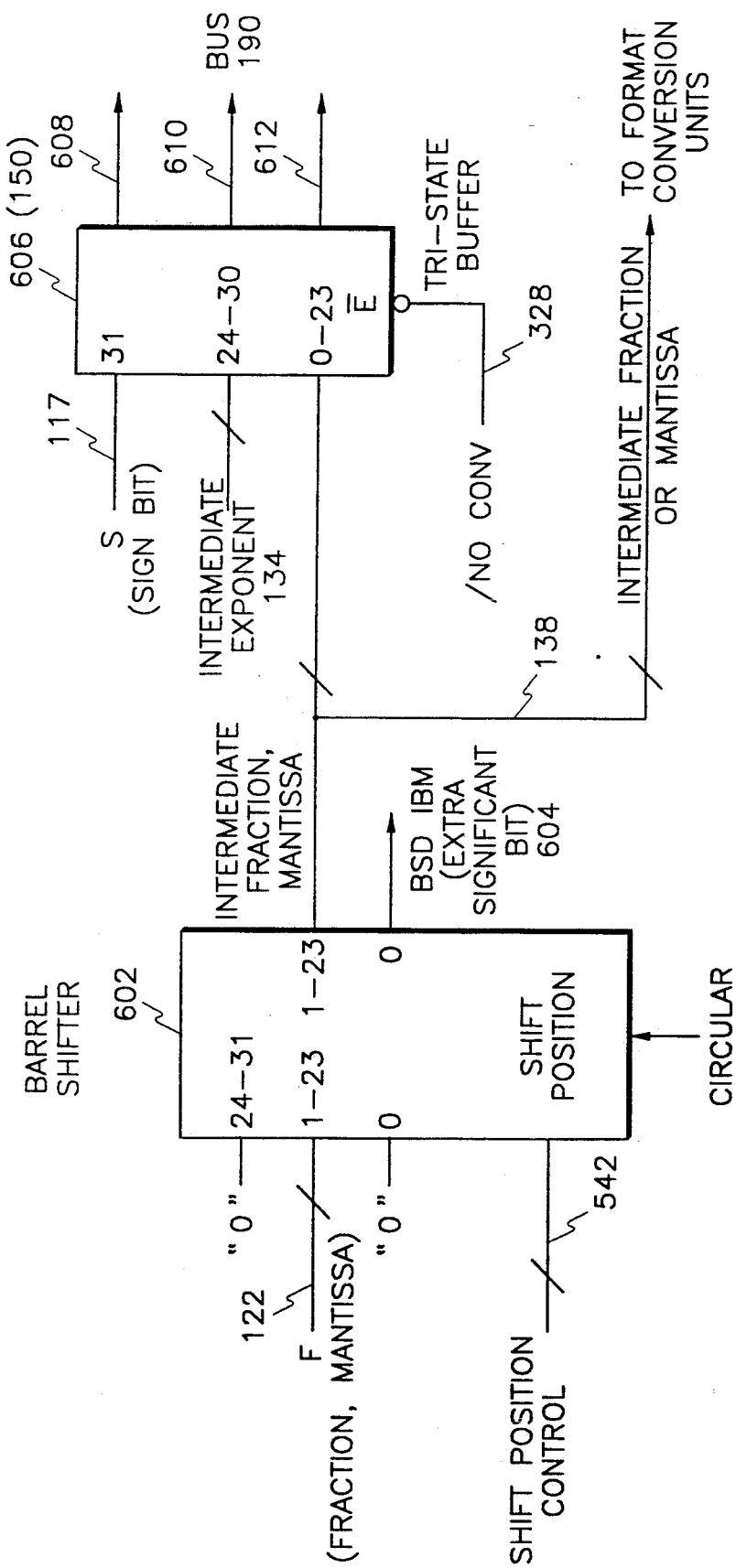
FIG. 6 is a diagram of the barrel shifter (130, FIG. 1) and a buffer for the "no convert" path.

Referring to FIG. 6, a barrel shifter 602 is illustrated, along with a buffer 606.

Barrel shifters 602 may comprise a single-shift SN74AS8838 32-bit barrel shifter, available from Texas Instruments, Incorporated, of Dallas, TX. The specifications of this chip may be found in the manual entitled *LSI LOGIC DATA BOOK* (SDVD001), published in 1986, which is incorporated by reference herein as if presented in its entirety. The source-format fraction or mantissa on path 122 enters data inputs D1–D23. This input represents the unshifted data from the source-format floating point word. Inputs D0 and D24–D31 are set to "0" voltage level.

The number of positions which a source-format fraction or mantissa must be shifted is determined by the shift position control word input along path 542 (FIG. 5). The MUX1 and MUX0 inputs of the SN74AS8838 barrel shifter are set to 1 and 0, respectively, so as to cause the barrel shifter to choose a "circular right" shift type (a shift toward the LSB). (Certain published documentation may refer to this shift as a circular left shift with the amount of places to be shifted represented in two's complement form.)

When the format conversion is to the IBM or SEL formats, the value of the shift position control word is non-zero, and a shift actually occurs within the barrel shifter. However, in the event of a conversion to a DEC format, or if no conversion is to take place at all, a shift position control word is 0 so that the fraction or mantissa of the source-format floating point word passes through the barrel shifter unchanged.

With the configuration shown in the FIG. 6, output bits 1–23 comprise the intermediate fraction or mantissa 138 (also shown in FIG. 1).

By carrying the output bit 0 out of the barrel shifter (indicated in FIG. 6 as signal BSD IBM 604) an extra bit of significance is gained when converting to the IBM or SEL formats. The BSD IBM bit 604 is sent to the least significant input data bit of format conversion units 170 and 180 as described below, with reference to FIG. 8.

An SN74AS8838 barrel shifter 602 is advantageously employed as the entirety of barrel shifter block 130 (FIG. 1), because the barrel shift operation takes approximately 25 nanoseconds. However, variations on the implementation of the shifting operation lying within the scope of the appended claims lies within the contemplation of the present invention. The present invention envisions a rapid calculation of the intermediate exponent 134 and intermediate fraction or mantissa 138, so that any implementation of the shifting block 130 and shift control block 126 serving this end lying within the appended claims falls within the purview of the present invention.

Also illustrated in FIG. 6 is a tri-state buffer 606 which functions as the preferred implementation of the "No Conversion" format conversion unit 150 (FIG. 1). The buffer's outputs are enabled by the /NOCONV control signal 328 from FIG. 3. The data inputs to the tri-state buffer 606 include sign bit 118 (FIG. 1), intermediate exponent 134 (FIG. 1 and FIG. 5), and the intermediate fraction or mantissa 138 (FIG. 1), and the output of barrel shifter in FIG. 6). When no conversion is to take place, the sign, intermediate exponent, and intermediate fraction or mantissa are output on paths 608, 610, and 612 to effectively bypass the true format conversion units 160, 170, and 180 to bus 190.

The /NOCONV signal ensures that the bus 190 is not improperly controlled by tri-state buffer 606 at times when other drivers should have control of the bus. Because operations occurring after data bus 190 are not central to the claimed floating point conversion device and method, they will not here be further described.

Figure 7:
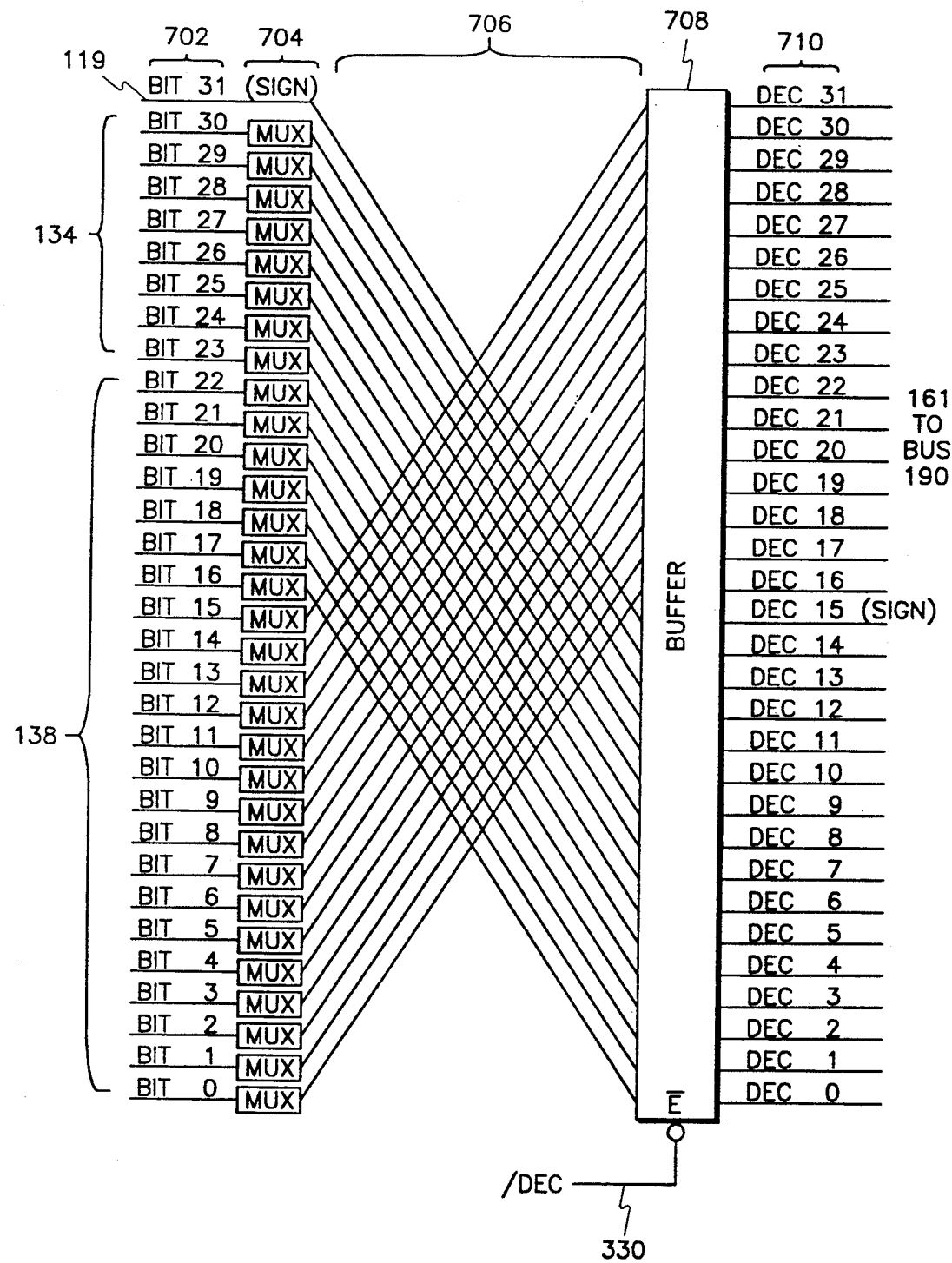
FIG. 7 is a diagram of the IEEE-to-DEC format conversion unit 160 (FIG. 1)
Figure 8:
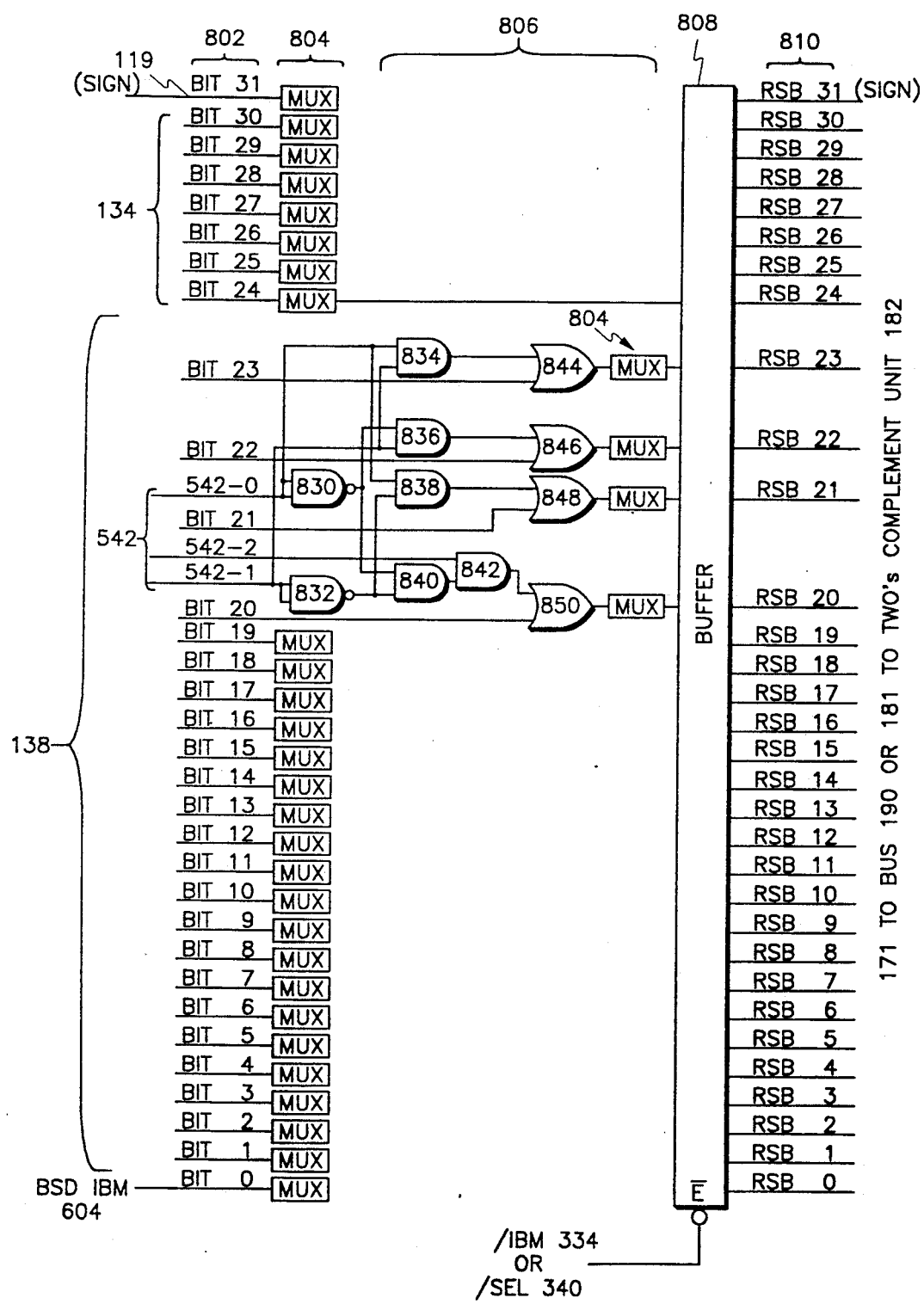
FIG. 8 is a diagram of the IEEE-to-IBM and IEEE-to-SEL format conversion units (170 and 180, FIG. 1)

FIGS. 7 and 8

The operation of format conversion units 160, 170, and 180 are next described, with reference to FIGS. 7 and 8.

Preferably, a Xilinx XC2018 logic cell (TM) array may be employed to form the format conversion functions. This chip is available from Xilinx, Inc. (2069 Hamilton Avenue, San Jose, CA). Enabling information on these chips and how to program them is available in the manual entitled *The Programmable Gate Array Data Book* (part number 0010048 01 from Xilinx, Inc., 1988), which is incorporated herein by reference as if reproduced in full below. However, variations on the implementation of the format conversion lie within the contemplation of the present invention, as defined by the appended claims.

In all three illustrated format conversion units 160, 170, and 180 a sign bit 119 is input to the high-order input data bit.

However, with respect to the exponent along path 134, a difference exists between the DEC format conversion unit 160, as compared with the IBM and SEL format conversion units 170 and 180. In the DEC conversion unit 160, the 8-bit exponent 134 is input to the eight next most significant bits. In contrast, the IBM and SEL format conversion units 170 and 180 receive the seven less significant bits of the exponent as inputs to the seven next most significant bits (next to the sign bit at the input to the logic array).

In all three format conversion units, the 23-bit shifted fraction or mantissa on 38 is input to the twenty-three next most significant input bits of the format conversion units (below the exponent). In the DEC conversion unit 160, all 32 input bits are thus occupied. However, because only seven bits of the IBM and SEL exponent were included as input bit, an extra bit remains in the IBM and SEL format conversion unit input. The least significant bit of the IBM and SEL format conversion units 170 and 180 receives the BSD-IBM bit 604 from FIG. 6. The BSD IBM bit 604 was output from the least significant bit of the barrel shifter 602, and advantageously provides an extra bit of significance in the IBM and SEL format conversions.

Advantageously, the same programmable gate array may be used for both the IBM and SEL format conversion units 170 and 180. However, due to the nature of the destination formats, it is not advisable to use this same programmable gate array for the DEC conversion 160. Thus, the following description separates the descriptions of the DEC format conversion unit 160 from that of the IBM and SEL format conversion units 170 and 180.

FIG. 7: Conversion to DEC Format. FIG. 7 illustrates the internal connections and logic functions performed within DEC format conversion 160. On the left side of FIG. 7, input bits 0–31 are illustrated generally at 702. The input bits comprise sign bit 119, intermediate exponent 134, and intermediate fraction or mantissa 138.

Figure 7A:
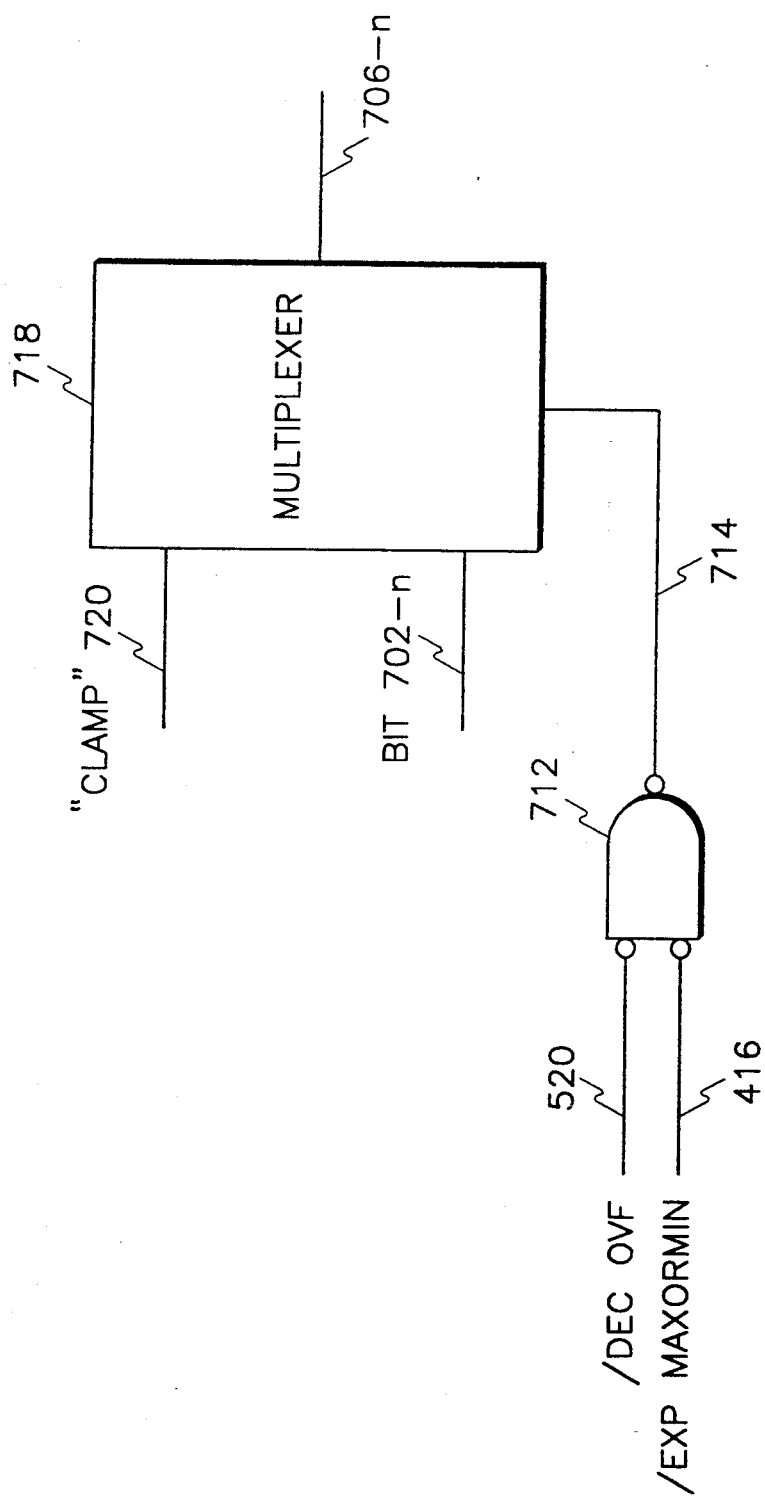
FIG. 7A is a diagram of a MUX unit which is illustrated in block form in FIG. 7.

Indicated at 704 are a bank of units indicated as MUX, an exemplary unit of which is indicated in FIG. 7A.

At 708 is a tri-state buffer whose outputs are enabled by the /DEC signal 330, generated in FIG. 3. At 701 is illustrated the DEC-format destination word which is output to bus 190 (FIG. when the /DEC enable signal 330 is active.

The region indicated generally as 706 indicates the manner in which the lower 16 bits and the upper 16 bits of the intermediate floating point word are switched before being input to buffer 708. Buffer 708 passes bits straight through to its outputs 710 on bus 190.

Referring now to FIG. 7A, the circuit indicated in FIG. 7 as MUX is illustrated in detail. Each block comprises a 2-input multiplexer whose select input path 714 is controlled by an active low input NAND gate 712. In practice, as would be apparent to those skilled in the art, the NAND gate may be advantageously placed outside the MUX unit itself, so as to avoid duplication of the NAND gate. The inputs to gate 712 are /DEC OVF 520, which indicates an overflow in the addition formed by adder 510 (FIG. 5). The second input to gate 712 is the /EXP MAXORMIN 416, which was generated on FIG. 4 to indicate that the exponent was in an all 1's or all 0's condition.

In the event that either of the signals 520 or 416 are inactive (here, high), then the multiplexer 718 is caused to select the data bit input at 702-N. If, on the other hand, both of the signals /DEC OVF 520 or /EXP MAXORMIN 416 are active (here, low), then multiplexer 718 will cause the outputs of all MUX units to output the same value, indicating how the 31 bits (other than the sign) of the intermediate word are to be replaced by a "clamp" bit 720.

If there is an overflow in adding $2_{10}$ to the IEEE exponent to form a DEC word, the word is thus "clamped" to the highest DEC number. Also, if the exponent of the input word is already at a maximum or minimum, the word will be clamped to a corresponding maximum or minimum value. Bit 30 represents whether a maximum or minimum exponent was presented.

In this manner, special situations in which the outputs are to be clamped are handled by the bank of MUX units 704. In the event that the clamp input is selected, a word of all 0's or all 1's (exclusive of the sign bit) is output through buffers 708.

FIG. 8: Conversion to IBM or SEL Format. Referring now to FIG. 8, input bits 802, MUX units 804 different than MUX unit 704, interconnection and logic portion 806, tri-state buffer 808, and output bits 810 are illustrated. Input bit 31 receives sign bit 119; bits 24–30 receive the seven least significant bits of intermediate exponent 134; bits 1–23 receive the intermediate fraction or mantissa 138; and bit 0 receives the BSD IBM bit 604 which was generated by the barrel shifter in FIG. 6.

Figure 8A:
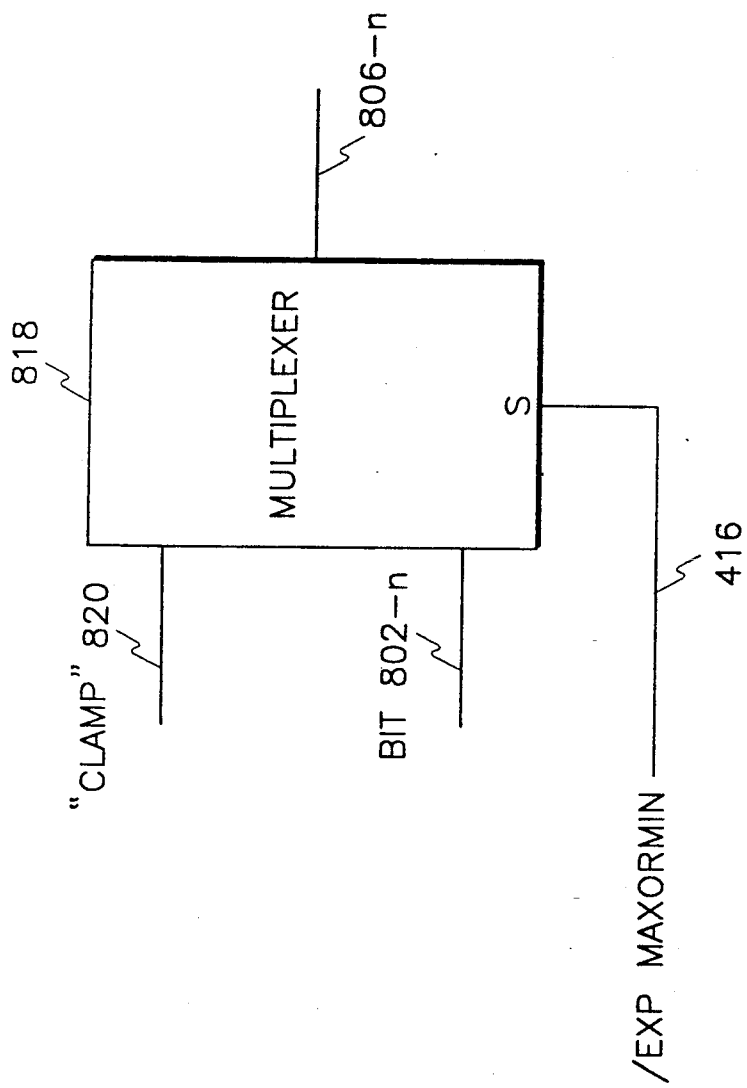
FIG. 8A is a diagram of a MUX unit which is illustrated in block form in FIG. 8.

Bits 0–19 and 24–31 enter MUX units 804 (an exemplary unit of which is illustrated in FIG. 8A). These 28 bits are carried straight across to the output buffer bits 810 of equal significance. The output buffer 808 is a tri-state buffer which is enabled by the /IBM signal 334 or the /SEL signal 340, depending on whether a particular format conversion unit is the IBM conversion unit 170 or the SEL conversion unit 180.

Figure 9:
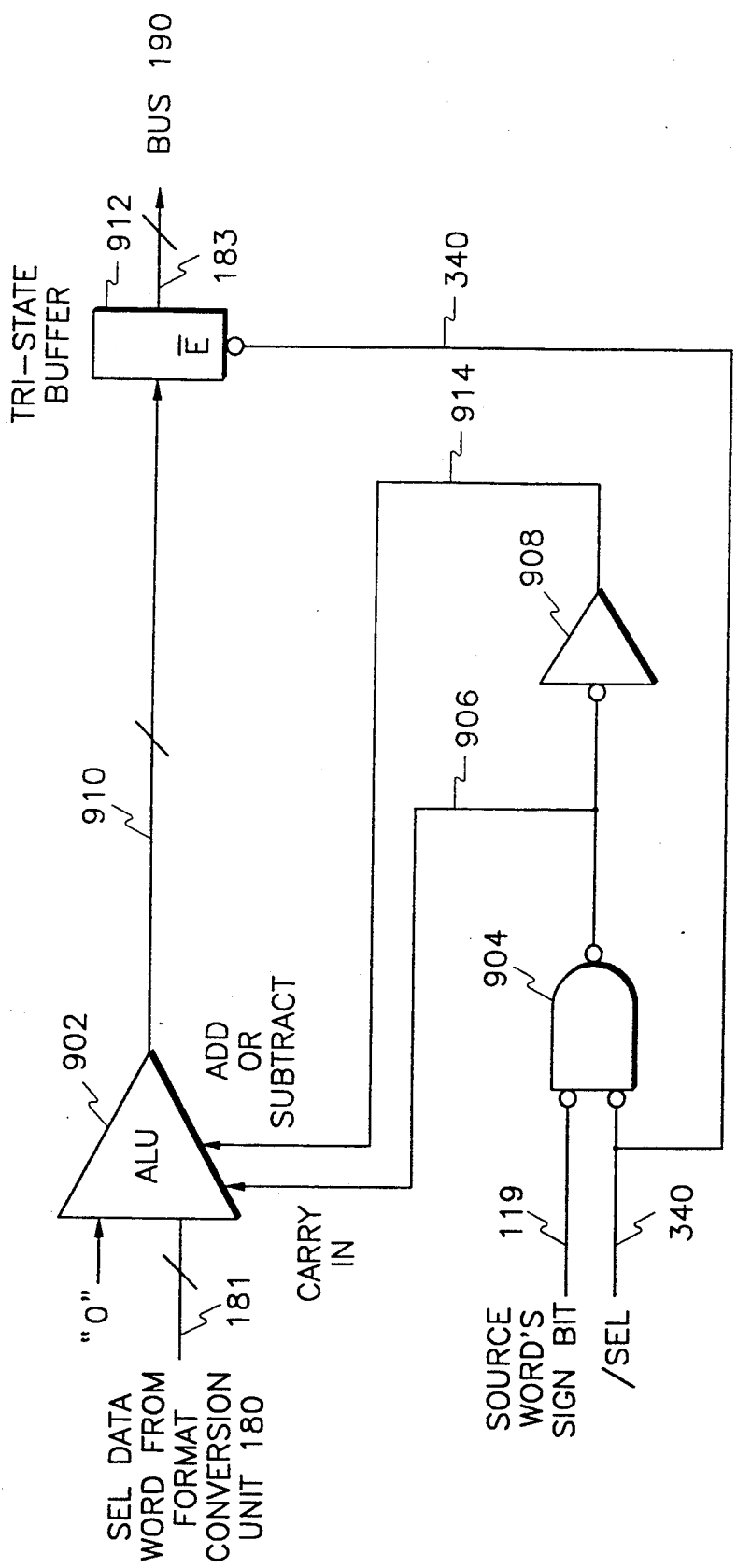
FIG. 9 is a diagram of the preferred embodiment of the 2's complement unit shown in block form as element 182 (FIG. 1).

Depending on whether the particular format conversion unit is being used as an IBM conversion unit 170 or a SEL conversion unit 180, the /IBM signal 334, or the /SEL signal 340 enables buffer 808. If the appropriate buffer enable signal is inactive, then buffer 808 presents a high impedance output. As shown in FIG. 1, the IBM format conversion unit 170 directly feeds bus 190 so that the /IBM buffer enable signal 334 helps to arbitrate control of bus 190. However, the SEL format conversion unit 180 (FIG. 1) must first pass through a 2's complement unit 182. A preferred embodiment of the 2's complement unit 182 is illustrated in FIG. 9.

Unlike the format conversion unit illustrated in FIG. 7, logic circuits determine output bits to 20–23 before the MUX unit (FIG. 8A) receives information. Input bits 20–23, as well the three least significant bits of the shift position control word 542, are input to the logic circuit within region 806.

As can be seen in FIG. 8, the IBM or SEL format conversion unit may be configured so as to form NAND gates 830 and 832, AND gates 834, 836, 838, 840, and 842; and OR gates 844, 846, 848, and 850.

Input bit 20 feeds the second input of OR gates 50. Input bit 21 feeds a second input of OR gate 48. Input bit 22 feeds the second input of OR gate 846. Finally, input bit 23 feeds the second input of OR gate 44.

The least significant bit of the shift position control word 542 feeds both inputs of NAND gate 830 so that it functions as an inverter. This least significant bit also feeds the first input of AND gates 834 and 838.

The second least significant bit of the shift position control word 542 feeds both inputs of NAND gate 832, as well a second input of AND gates 834 and 836.

The third least significant bit of the shift position control word 542 feeds the first input of AND gate 842.

The output of NAND gate 830 feeds the first input of AND gate 836 and the first input of AND gate 840. The output of NAND gate 832 feeds the second input of AND gate 838 and the second input of AND gate 840.

The output of AND gate 840 feeds the second input of AND gate 842.

The respective outputs of AND gates 834, 836, 838, and 842 feed the first input of respective OR gates 844, 846, 848, and 850.

Finally, the outputs of OR gates 844, 846, 848, and 850 feed the respective bit inputs of the MUX units which are described in detail with respect to FIG. 8A Briefly, the set of gates 830–850 (FIG. 8) perform the "OR" function on the implied bit of the IEEE format.

The bitwise position of this implied bit is determined by the shift position control bits 542. See above, the sections on "IEEE Floating Point Format" near the beginning of the Detailed Description of the Preferred Embodiments, and the description following Table I.

Referring now to FIG. 8A, the MUX units 804 from FIG. 8 each comprise a multiplexer such as that indicated at 818. The select input to the multiplexer is the /EXP MAXORMIN signal 416 from FIG. 4. If the /EXP MAXORMIN signal is inactive (here, high), the multiplexer 818 selects the input data bit 0–19, 24–31, or the output of OR gates 844, 846, 848, or 850 (FIG. 8). However, if /EXP MAXORMIN is active, a "clamped" input is selected by the multiplexer 818. In a preferred embodiment, the clamped input is the most significant bit of the exponent of the input data word so that, in the case of an IEEE-format source floating point number, bit 30 of the input data word is connected to the input of the multiplexer opposite the particular data bit. If the clamp input is selected, an IBM (or SEL) format number of all 0's or all 1's is input to the buffer 808 (FIG. 8).

FIG. 9

Referring to FIG. 9, a preferred embodiment of the 2's complement conversion unit 182 is illustrated in the schematic form. Briefly, if the conversion is to the SEL format, then the sign bit from the source floating point word determines whether the SEL data word from format conversion unit 180 is subtracted from 0 (2's complement) or whether it is passed through unchanged Referring more specifically to the components of FIG. 9, an arithmetic logic unit 902 receives a "0" in its first input, and the SEL data word from format conversion unit 180 along path 181 in its second input. The determination of whether arithmetic logic unit 902 adds 0 to the SEL data word on path 181, or whether it subtracts the SEL data word on path 181 from 0 (2's complement) may be determined by an "add or subtract" input which is fed by a path 914.

In the preferred embodiment, the "add or subtract" input is determined as follows. An active-low input NAND gate 904 receives the source word's sign bit along path 119 to its first input, and receives its second input from the /SEL control bit 340 (generated on FIG. 3). Therefore, when a conversion to the SEL format is indicated by bit 340, the output along path 906 of gate 904 receives the value of the source word's sign bit.

The sign bit on path 906 also feeds the input of inverter 908. The output path 914 of the inverter 908 thus comprises the inverted sign bit from the source-format word when a conversion to the SEL format is taking place. This output 914 of the inverter 908 comprises the "add or subtract" control signal to ALU 902.

Thus, when the sign bit along 119 is 1 (indicating a negative number), then the ALU performs the "0—SEL data word" operation. Conversely, when the source word's sign bit along 119 is 0 (indicating a positive number) than ALU 902 performs the "0+SEL data word" function.

The ALU 902 outputs its result on path 910 to the input of tri-state buffer 912. Tri-state buffer 912 presents a high-impedance output of path 183 to bus 190 unless it is enabled by the /SEL control signal on path 340 (generated on FIG. 3 to indicate a conversion to the SEL format).

In the preferred embodiment. ALU 902 may be implemented using 74F382 ALU's, available from a wide variety of vendors, such as Texas Instruments, Inc., or Motorola, Inc. If a 74F382 is employed, the carry-out outputs from each chip should be connected to the carry-in inputs of the next chip in a manner known to those skilled in the art.

However, as illustrated in FIG. 9, path 906, the uninverted sign bit, should be connected to the carry input of the lowest-order chip. The carry input is the true carry input for addition operations, and the inverted carry input for subtraction functions of the ALU. Thus, when the sign bit signifies a subtraction from zero, the carry input is at a logical "1" state so that no carry input is performed. The opposite is true if the sign bit is zero, causing an addition of zero to the number.

To achieve the switchable "add or subtract" function governed by path 914, the output of inverter 908 should be connected to the S1 inputs of the 74F382 chips. The S0 input should be tied high, with the S2 input tied low. In this manner, the three select inputs S0, S1, and S2 effectively switch between adding the two inputs of the ALU to subtracting the second input of the ALU from the first input of the ALU.

In a manner described with respect to other tri-state buffers, tri-state buffer 912 selectably controls bus 190 to pass the converted SEL floating point word out of the conversion device.

Conclusion

Whereas various features of the preferred embodiments of the present invention have been presented above in detail, it is to be understood that they have been presented by way of example, and not limitation.

The present invention may find use in any application where it is necessary or useful to change the base of an exponent in a floating point number conversion, and where speed of conversion is desirable. The conversion need not be from the IEEE format as a source format, nor need it be limited to IBM, SEL or DEC formats as destination formats. Nor need the conversions be made only on 32-bit numbers, or even on source numbers having the same length as the destination numbers. Furthermore, the particular hardware implementations need not be limited to those described above. The PLA's or barrel shifters may be replaced by discrete logic, in any situations where that might be advantageous. Furthermore, the teachings of the present invention need not be implemented in hardware; rather, they may be embodied in software or firmware.

Thus, the scope of the present invention should be limited not by the above exemplary embodiments, but only in accordance with the following claims and their equivalents.

What is claimed is:

1. An apparatus for converting a source-format floating point number into a destination-format floating point number, comprising:

a) a shift control block for receiving an exponent of the source-format floating point number and one or more control signals, the shift control block comprising:

1) an internal control block for receiving a control signal specifying the destination floating point format specification control signal and producing a set of destination-format-driven circuit enable signals for selectively enabling circuits in the apparatus;

2) an exponent fill circuit responsive to the exponent of the source-format floating point number for generating special-case control signals;

3) an exponent increment determination circuit, responsive to the destination-format-driven circuit enable signals from the internal control block, for generating a first exponent increment number and possibly also a second exponent increment number;

4) an exponent addition circuit responsive to the exponent of the source-format floating point number, the special-case control signals, and the exponent increment number(s), for producing a shift position control signal and an intermediate exponent, the exponent addition circuit comprising i) a first adder for receiving the first exponent increment number and generating a first potential intermediate exponent,
      A) the least significant bits of which are input to a shift position control signal generation circuit so as to selectively generate the least significant bits of the shift position control signal, and
      B) the most significant bits of which are input to a second adder; and
   ii) the second adder, receiving the most significant bits of the first potential intermediate exponent output from the first adder, also receiving at the same input at least one of the special case control signals from the exponent fill block, the second adder receiving the second exponent increment number from the exponent increment determination circuit, the second adder outputting a second potential intermediate exponent; and
   iii) a selection circuit for producing the intermediate exponent from either the first or second potential intermediate exponents, depending on the destination-format-driven circuit enable signals from the internal control block; and
   iv) the shift position control signal generation circuit, receiving the least significant bits of the first potential intermediate exponent from the first adder, and selectively outputting as the least significant bits of the shift position control signal either a predetermined signal or the least significant bits as part of the shift position control signal, depending on the destination-format-driven circuit enable signals from the internal control block;

b) a barrel shifter for receiving a fraction or mantissa of the source-format floating point number and shifting the fraction or mantissa zero or more bits in accordance with the shift position control signal from the shift control block, so as to produce an intermediate fraction or mantissa;

c) one or more format conversion units for receiving the intermediate exponent and the intermediate fraction or mantissa, for formatting the intermediate fraction or mantissa and the intermediate exponent into the destination-format floating point number, the format conversion units comprising 1) a programmable logic array for routing the bits of the fraction or mantissa and exponent to proper bit positions in the destination-format floating point number; or 2) a buffer for receiving the intermediate exponent and fraction or mantissa when the source format and the destination format are identical; and d) a selection circuit for selecting the output from the format conversion unit producing the destination-format floating point number when more than one format conversion unit is present, the selection circuit comprising tri-state buffers or selectors responsive to the outputs of the format conversion units and to the destination-format-driven circuit enable signals from the internal control block in the shift control block, for arbitrating which format conversion unit produces the destination-format floating point number which is output from the apparatus.

2. An apparatus for converting a source-format floating point number into a destination-format floating point number, comprising:

a) a shift position control block for receiving an exponent of the source-format floating point number to produce a shift position control signal and an intermediate exponent, said shift control block comprising:
   1) a dividing circuit for dividing the value of said exponent by a first number, wherein the first number is related to the logarithm, to the base of the source-format floating point number's exponent, of the base of the destination-format floating point number's exponent;
   2) a computation circuit for arranging the quotient of said dividing circuit into an integer and a remainder by subtracting a second number from the remainder when required by the destination format, and compensating for the subtraction in the remainder by adjusting the value of the integer;
   3) a shift position control output for presenting said shift position control signal to said shift register in accordance with said remainder; and
   4) an intermediate exponent output for outputting said intermediate exponent;

b) a shift register comprising a barrel shifter for receiving a fraction or mantissa of the source-format floating point number and shifting said fraction or mantissa zero or more bits in accordance with said shift position control signal received from said shift control block, so as to produce an intermediate fraction or mantissa;

c) one or more format conversion units for receiving said intermediate exponent and said intermediate fraction or mantissa, for formatting said intermediate fraction or mantissa and said intermediate exponent into the destination-format floating point number; and d) a selection circuit for selecting the output from the format conversion unit producing the destination-format floating point number for output when more than one format conversion unit is present.

3. An apparatus for converting a source-format floating point number into a destination-format floating point number, comprising:
   a shift control block for receiving an exponent of the source-format floating point number to produce a shift position control signal and an intermediate exponent;
   a shift register for receiving a fraction or mantissa of the source-format floating point number and shifting said fraction or mantissa zero or more bits in accordance with said shift position control signal received from said shift control block, so as to produce an intermediate fraction or mantissa;

one or more format conversion units for receiving said intermediate exponent and said intermediate fraction or mantissa, for formatting said intermediate fraction or mantissa and said intermediate exponent into the destination-format floating point number; and a selection circuit for selecting the output from the format conversion unit producing the destination-format floating point number for output when more than one format conversion unit is present.

4. The apparatus of claim 3, wherein said format conversion units comprise programmable logic arrays (PLA's).

5. The apparatus of claim 3, wherein said source-format floating point number is in the IEEE format, and the destination-format floating point number is in the DEC format.

6. The apparatus of claim 3, wherein said source-format floating point number is in the IEEE format, and the destination-format floating point number is in the IBM format.

7. The apparatus of claim 3, wherein said source-format floating point number is in the IEEE format, and the destination-format floating point number is in the SEL format.

8. The apparatus of claim 3, wherein said source-format floating point number is in the IEEE format, and the destination-format floating point number is also in the IEEE format.

9. The apparatus of claim 3, wherein said shift register comprises a barrel shifter.

10. The apparatus of claim 3, further comprising a command word register for receiving one or more signals which specify the destination format for one or more source-format floating point numbers.

11. The apparatus according to claim 10, wherein said selection circuit comprises a data bus with bus arbitration logic governed by a command word specifying the destination format.

12. The apparatus of claim 3, wherein said shift control block comprises:

a dividing circuit for dividing the value of said exponent by a first number, wherein the first number is related to the logarithm, to the base of the source-format floating point number's exponent, of the base of the destination-format floating point number's exponent;

a computation circuit for arranging the quotient of said dividing circuit into an integer and a remainder by subtracting a second number from the remainder when required by the destination format, and compensating for the subtraction in the remainder by adjusting the value of the integer;

a shift position control output for presenting said shift position control signal to said shift register in accordance with said remainder and an exponent output for outputting said intermediate exponent.

13. The apparatus of claim 12, wherein:
the base of the exponent of the source-format floating point number is 2;
the base of the exponent of the destination-format floating point number is 16;
said first number is 4; and
said second number is 1.

14. The apparatus of claim 12, wherein:
the base of the exponent of the source-format floating point number is 2;
the base of the exponent of the destination-format floating point number is 2;
said first number is 1; and
said second number is 1.

15. The apparatus of claim 3, wherein one or more of said one or more format conversion units comprise a clamping circuit for limiting the value of the destination-format floating point number to a predetermined value in special cases such as infinities.

16. A method for converting a source-format floating point number to a destination-format floating point number, comprising the steps of:

receiving in a register the source-format floating point number, said source-format floating point number comprising at least a fraction or mantissa, and an exponent;

determining an intermediate exponent in a shift controller coupled to said register, based on the exponent of the source-format floating point number and on the destination format, so as to produce a shift position control signal;

shifting said fraction or mantissa in a barrel shifter coupler to said register zero or more bit positions in accordance with said shift position control signal so as to produce an intermediate fraction or mantissa;

generating a signal in a command register for selecting a format conversion unit; and formatting said intermediate fraction or mantissa, and said intermediate exponent in the selected format conversion unit, into the destination-format floating point number.

17. The method of claim 16, wherein said format conversion comprises a conversion from IEEE-format floating point numbers to DEC-format floating point numbers.

18. The method of claim 16, wherein said format conversion comprises a conversion from IEEE format floating point numbers to IBM-format floating point numbers.

19. The method of claim 16, wherein said format conversion comprises a conversion from IEEE-format floating point numbers to SEL-format floating point numbers.

20. The method of claim 16, wherein said format conversion comprises a conversion from IEEE-format floating point numbers to IEEE-format floating point numbers.

21. The method of claim 16, wherein said determining step comprises:

dividing the exponent of the source-format floating point number by a first number, wherein the first number is related to the logarithm, to the base of the source-format floating point number's exponent, of the base of the destination-format floating point number's exponent, said dividing step producing a quotient comprising an integer and a remainder;

subtracting a second number from the remainder in accordance with the destination format to produce an adjusted remainder;

adjusting the value of said integer to compensate for said subtracting step;

outputting said shift position control signal in accordance with said adjusted remainder; and outputting said intermediate exponent in accordance with the value of said integer.

22. The method of claim 21, wherein:

said receiving step comprises receiving a source-format floating point number having a base 2 exponent;

said formatting step comprises formatting into destination-format floating point numbers having a base 16 exponent;

said dividing step comprises dividing by 4; and said subtracting step comprises subtracting 1.

23. The method of claim 21, wherein:

said receiving step comprises receiving a source-format floating point number having a base 2 exponent;

said formatting step comprises formatting into destination-format floating point numbers having a base 2 exponent;

said dividing step comprises dividing by 1; and said subtracting step comprises subtracting 1.

24. The method of claim 16, wherein said formatting step comprises clamping the intermediate fraction or mantissa, and said intermediate exponent, to a predetermined value of the destination-format floating point for special cases such as infinities.

* * * * *